United States Patent [19]
Turner et al.

[11] Patent Number: 5,847,913
[45] Date of Patent: Dec. 8, 1998

[54] TRIP INDICATORS FOR CIRCUIT PROTECTION DEVICES

[75] Inventors: Duane L. Turner; Dennis W. Fleege; Gregory S. Wiese, all of Cedar Rapids; Robert F. Dvorak, Mt. Vernon, all of Iowa

[73] Assignee: Square D Company, Palatine, Ill.

[21] Appl. No.: 804,420

[22] Filed: Feb. 21, 1997

[51] Int. Cl.⁶ .................................................. H02H 3/00
[52] U.S. Cl. .............................. 361/93; 361/42; 361/79; 361/115
[58] Field of Search ................................. 361/42, 45, 93, 361/115, 79; 340/638, 644

[56] References Cited

U.S. PATENT DOCUMENTS

| | | | |
|---|---|---|---|
| H536 | 10/1988 | Strickland et al. | 324/456 |
| Re. 30,678 | 7/1981 | Van Zeeland et al. | 361/44 |
| 2,808,566 | 10/1957 | Douma | 324/127 |
| 2,832,642 | 4/1958 | Lennox | 299/132 |
| 2,898,420 | 8/1959 | Kuze | 200/87 |
| 3,471,784 | 10/1969 | Arndt et al. | 324/126 |
| 3,538,241 | 11/1970 | Rein | 174/143 |
| 3,588,611 | 6/1971 | Lambden et al. | 317/31 |
| 3,600,502 | 8/1971 | Wagenaar et al. | 174/143 |
| 3,622,872 | 11/1971 | Boaz et al. | 324/52 |
| 3,684,955 | 8/1972 | Adams | 324/72 |
| 3,746,930 | 7/1973 | Van Best et al. | 317/31 |
| 3,775,675 | 11/1973 | Freeze et al. | 324/51 |
| 3,812,337 | 5/1974 | Crosley | 235/153 AC |
| 3,858,130 | 12/1974 | Misencik | 335/18 |

(List continued on next page.)

FOREIGN PATENT DOCUMENTS

| | | | |
|---|---|---|---|
| 0 094 871 A1 | 5/1983 | European Pat. Off. | H02H 1/00 |
| 0094871 | 5/1983 | European Pat. Off. | H02H 1/00 |
| 0 615 327 | 9/1994 | European Pat. Off. | H02H 1/00 |
| 0 649 207 A1 | 4/1995 | European Pat. Off. | H02H 3/04 |
| 0 748 021 A1 | 12/1996 | European Pat. Off. | H02H 1/00 |
| 0 762 591 A2 | 3/1997 | European Pat. Off. | H02H 3/33 |
| 0 802 602 A2 | 10/1997 | European Pat. Off. | H02H 1/00 |
| 0813281 | 12/1997 | European Pat. Off. | H02H 1/00 |
| 2 177 561 | 6/1985 | United Kingdom | H02H 3/00 |
| 2285886 | 7/1995 | United Kingdom | H01H 71/74 |
| WO 97/30501 | 8/1997 | WIPO | H02H 1/00 |

OTHER PUBLICATIONS

Antonio N. Paolantonio, P.E., Directional Couplers, R.F. Design, Sep./Oct., 1979, pp. 40–49.

Alejandro Duenas, J., Directional Coupler Design Graphs For Parallel Coupled Lines and Interdigitated 3 dB Couplers, RF Design, Feb. 1986, pp. 62–64.

RV4145 Low Power Ground Fault Interrupter, Preliminary Product Specifications of Integrated Circuits, Raytheon Company Semiconductor Division, 350 Ellis Street, Mountain view CA 94309–7016, pp. 1–8.

(List continued on next page.)

*Primary Examiner*—Jeffrey Gaffin
*Assistant Examiner*—Stephen W. Jackson
*Attorney, Agent, or Firm*—Larry I. Golden; Kareem M. Irfan

[57] ABSTRACT

A trip indicator for a circuit breaker in an electrical distribution system. The trip indicator provides a visual indication of the activation of a trip signal caused by arcing fault detector (AFD) or ground fault interrupter (GFI) circuitry. The trip indicator comprises one or more light sources, one or more plungers having a colored tip or one or more bimetal disk having a colored top. In response to activation of a trip signal by the AFD or GFI circuitry, the light source(s) illuminate, the plunger(s) move from a retracted position to an extended position and the bimetal disk(s) move from a generally flat position to a convex position. A conduit is provided within the housing of the protective device for conveying light or the reflection of light between the light source(s), plunger(s) or bimetal disk(s) and an opening of the housing. Where the circuit breaker includes both GFI and AFD circuitry, each generating a respective trip signal in response to the detection of a ground fault or arcing fault, the trip indicator is designed to indicate which of the respective fault conditions activated the trip signal.

52 Claims, 16 Drawing Sheets

U.S. PATENT DOCUMENTS

| | | | |
|---|---|---|---|
| 3,869,665 | 3/1975 | Kenmochi et al. | 324/72 |
| 3,878,460 | 4/1975 | Nimmersjo | 324/52 |
| 3,911,323 | 10/1975 | Wilson et al. | 317/18 |
| 3,914,667 | 10/1975 | Waldron | 317/36 |
| 3,932,790 | 1/1976 | Muchnick | 317/18 D |
| 3,939,410 | 2/1976 | Bitsch et al. | 324/72 |
| 4,052,751 | 10/1977 | Shepard | 361/50 |
| 4,074,193 | 2/1978 | Kohler | 324/126 |
| 4,081,852 | 3/1978 | Coley et al. | 361/45 |
| 4,087,744 | 5/1978 | Olsen | 324/51 |
| 4,156,846 | 5/1979 | Harrold et al. | 324/158 |
| 4,169,260 | 9/1979 | Bayer | 340/562 |
| 4,214,210 | 7/1980 | O'Shea | 455/282 |
| 4,245,187 | 1/1981 | Wagner et al. | 324/54 |
| 4,251,846 | 2/1981 | Pearson et al. | 361/30 |
| 4,264,856 | 4/1981 | Frierdich et al. | 322/25 |
| 4,316,187 | 2/1982 | Spencer | 340/664 |
| 4,354,154 | 10/1982 | Schiemann | 324/126 |
| 4,356,443 | 10/1982 | Emery | 324/51 |
| 4,387,336 | 6/1983 | Joy et al. | 324/51 |
| 4,459,576 | 7/1984 | Fox et al. | 336/84 |
| 4,466,071 | 8/1984 | Russell, Jr. | 364/492 |
| 4,639,817 | 1/1987 | Cooper et al. | 361/62 |
| 4,642,733 | 2/1987 | Schacht | 361/363 |
| 4,644,439 | 2/1987 | Tarning | 361/87 |
| 4,652,867 | 3/1987 | Masot | 340/638 |
| 4,658,322 | 4/1987 | Rivera | 361/37 |
| 4,697,218 | 9/1987 | Nicolas | 633/882 |
| 4,707,759 | 11/1987 | Bodkin | 831/642 |
| 4,771,355 | 9/1988 | Emery et al. | 361/33 |
| 4,810,954 | 3/1989 | Fam | 324/142 |
| 4,833,564 | 5/1989 | Pardue et al. | 361/93 |
| 4,835,648 | 5/1989 | Yamauchi | 361/14 |
| 4,845,580 | 7/1989 | Kitchens | 361/91 |
| 4,853,818 | 8/1989 | Emery et al. | 361/33 |
| 4,858,054 | 8/1989 | Franklin | 361/57 |
| 4,866,560 | 9/1989 | Allina | 361/104 |
| 4,882,682 | 11/1989 | Takasuka et al. | 364/507 |
| 4,893,102 | 1/1990 | Bauer | 335/132 |
| 4,901,183 | 2/1990 | Lee | 361/56 |
| 4,922,368 | 5/1990 | Johns | 361/62 |
| 4,931,894 | 6/1990 | Legatti | 361/45 |
| 4,939,495 | 7/1990 | Peterson et al. | 337/79 |
| 4,949,214 | 8/1990 | Spencer | 361/95 |
| 4,969,063 | 11/1990 | Scott et al. | 361/93 |
| 5,010,438 | 4/1991 | Brady | 361/56 |
| 5,047,724 | 9/1991 | Boksiner et al. | 324/520 |
| 5,051,731 | 9/1991 | Guim et al. | 340/638 |
| 5,121,282 | 6/1992 | White | 361/42 |
| 5,166,861 | 11/1992 | Krom | 361/379 |
| 5,168,261 | 12/1992 | Weeks | 340/515 |
| 5,179,491 | 1/1993 | Runyan | 361/45 |
| 5,185,684 | 2/1993 | Beihoff et al. | 361/45 |
| 5,185,685 | 2/1993 | Tennies et al. | 361/45 |
| 5,185,686 | 2/1993 | Hansen et al. | 361/45 |
| 5,185,687 | 2/1993 | Beihoff et al. | 361/45 |
| 5,206,596 | 4/1993 | Beihoff et al. | 324/536 |
| 5,208,542 | 5/1993 | Tennies et al. | 324/544 |
| 5,223,795 | 6/1993 | Blades | 324/536 |
| 5,224,006 | 6/1993 | MacKenzie et al. | 361/45 |
| 5,257,157 | 10/1993 | Epstein | 361/111 |
| 5,280,404 | 1/1994 | Ragsdale | 361/113 |
| 5,286,933 | 2/1994 | Pham | 200/144 B |
| 5,307,230 | 4/1994 | MacKenzie | 361/96 |
| 5,334,939 | 8/1994 | Yarbrough | 324/424 |
| 5,353,014 | 10/1994 | Carroll et al. | 340/638 |
| 5,359,293 | 10/1994 | Boksiner et al. | 324/544 |
| 5,363,269 | 11/1994 | McDonald | 361/45 |
| 5,383,084 | 1/1995 | Gershen et al. | 361/113 |
| 5,388,021 | 2/1995 | Stahl | 361/56 |
| 5,396,179 | 3/1995 | Domenichini et al. | 324/546 |
| 5,412,526 | 5/1995 | Kapp et al. | 361/56 |
| 5,414,590 | 5/1995 | Tajali | 361/669 |
| 5,420,740 | 5/1995 | MacKenzie et al. | 361/45 |
| 5,424,894 | 6/1995 | Briscall et al. | 361/45 |
| 5,434,509 | 7/1995 | Blades | 324/536 |
| 5,444,424 | 8/1995 | Wong et al. | 335/172 |
| 5,446,431 | 8/1995 | Leach et al. | 335/18 |
| 5,448,443 | 9/1995 | Muelleman | 361/111 |
| 5,452,223 | 9/1995 | Zuercher et al. | 364/483 |
| 5,459,630 | 10/1995 | MacKenzie et al. | 361/45 |
| 5,477,150 | 12/1995 | Ham, Jr. et al. | 324/536 |
| 5,481,235 | 1/1996 | Heise et al. | 335/18 |
| 5,483,211 | 1/1996 | Carrodus et al. | 335/18 |
| 5,485,093 | 1/1996 | Russell et al. | 324/522 |
| 5,493,278 | 2/1996 | MacKenzie et al. | 340/638 |
| 5,506,789 | 4/1996 | Russell et al. | 364/492 |
| 5,510,946 | 4/1996 | Franklin | 361/56 |
| 5,512,832 | 4/1996 | Russell et al. | 324/522 |
| 5,519,561 | 5/1996 | Mrenna et al. | 361/105 |
| 5,531,617 | 7/1996 | Marks | 439/723 |
| 5,546,266 | 8/1996 | Mackenzie | 361/93 |
| 5,561,605 | 10/1996 | Zuercher et al. | 364/483 |
| 5,568,371 | 10/1996 | Pitel et al. | 363/39 |
| 5,578,931 | 11/1996 | Russell et al. | 324/536 |
| 5,590,012 | 12/1996 | Dollar | 361/113 |
| 5,602,709 | 2/1997 | Al-Dabbagh | 361/85 |
| 5,608,328 | 3/1997 | Sanderson | 324/529 |
| 5,657,244 | 8/1997 | Seitz | 364/492 |
| 5,659,453 | 8/1997 | Russell et al. | 361/93 |
| 5,682,101 | 10/1997 | Brooks et al. | 324/536 |
| 5,691,869 | 11/1997 | Engel et al. | 361/42 |
| 5,701,110 | 12/1997 | Scheel et al. | 335/132 |
| 5,706,154 | 1/1998 | Seymour | 361/42 |
| 5,726,577 | 3/1998 | Engel et al. | 324/536 |
| 5,729,145 | 3/1998 | Blades | 324/536 |

OTHER PUBLICATIONS

Jean–Francois Joubert, Feasibility of Main Service Ground–Fault Protection On The Electrical Service To Dwelling Units, Consultants Electro–Protection Ins., 1980, Michelin St., Laval Quebec H7L 9Z7. Oct. 26, 1990, pp. 1–77.

R.D. Russell, Detection Of Arcing Faults On Distribution Feeders, Texas A & M Research Foundation, Box H. College Station, Texas 77843, Final Report Dec., 1982, pp. 1–B18.

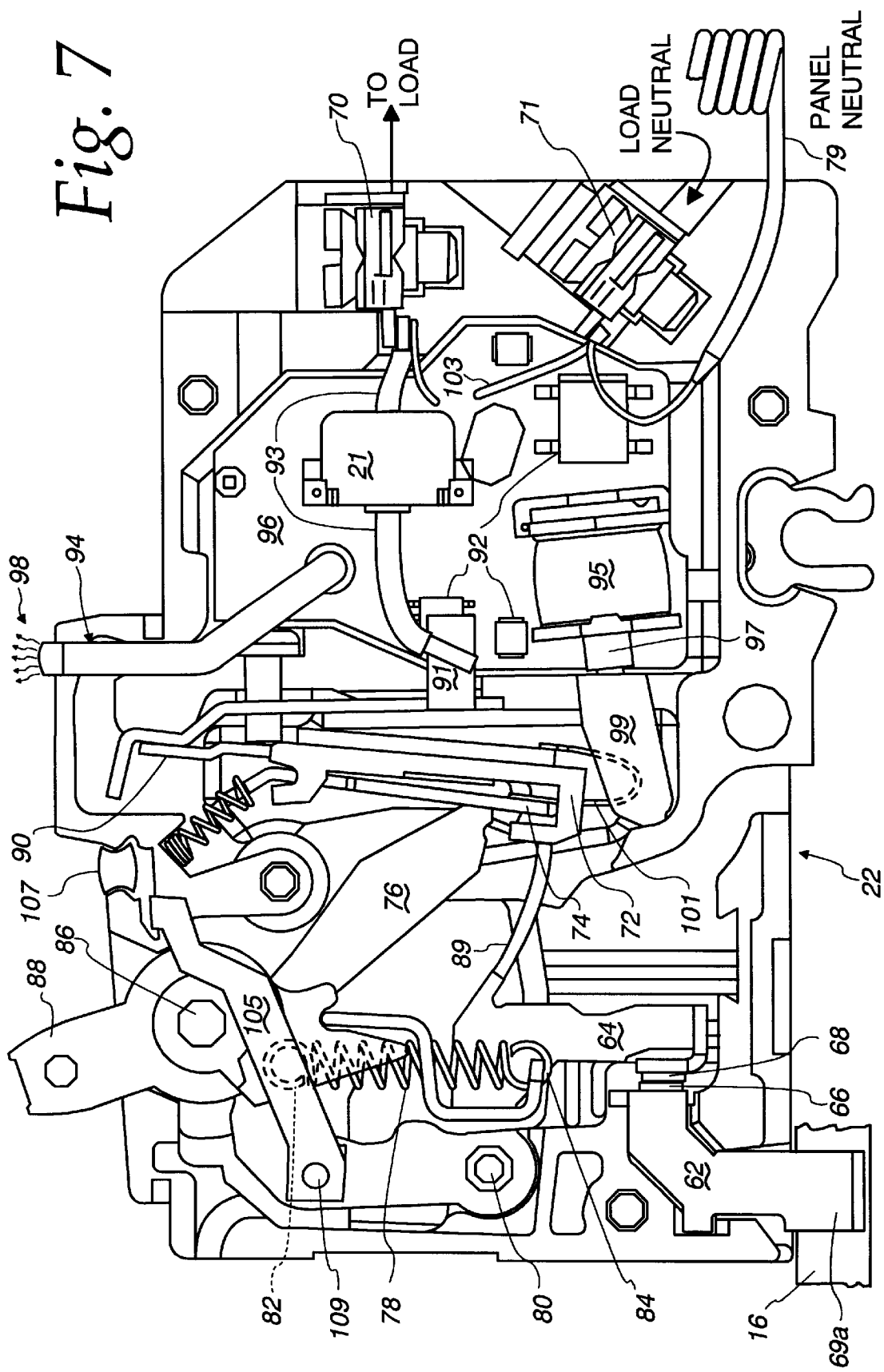

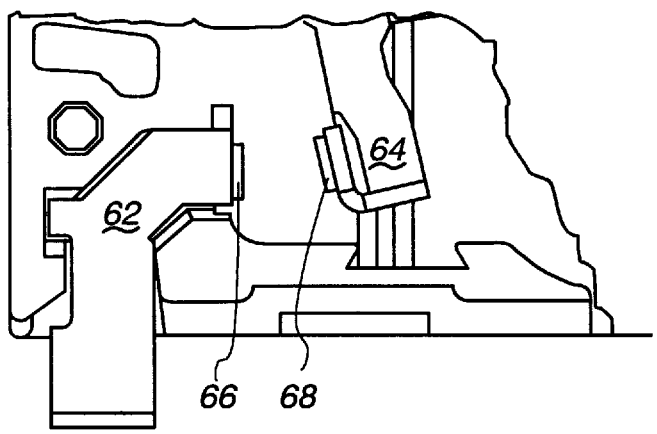
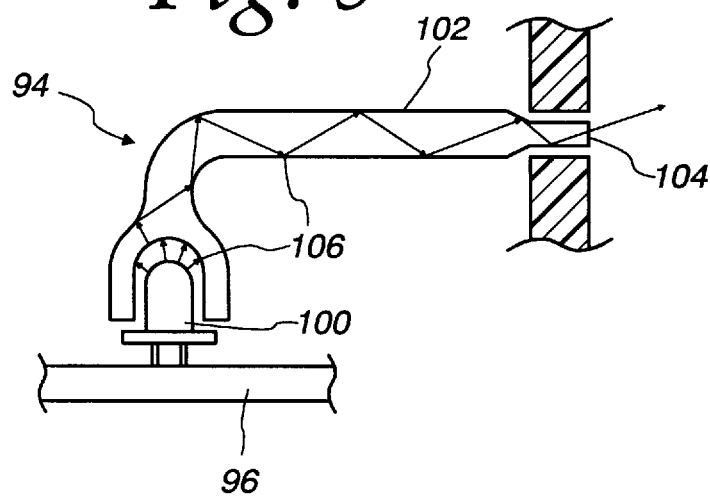
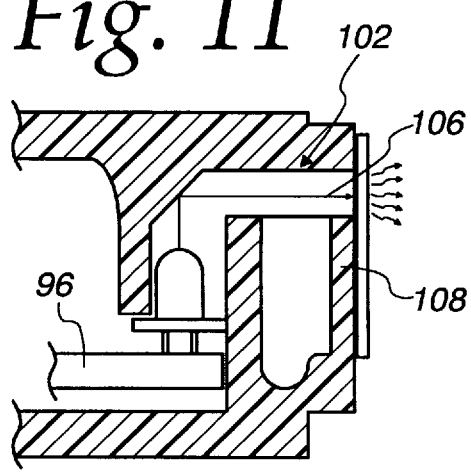

TRIP INDICATORS FOR CIRCUIT PROTECTION DEVICES

FIELD OF THE INVENTION

The present invention relates generally to circuit protection devices in electrical distribution systems and, more particularly, to trip indicators for indicating when a circuit protection device has tripped open in response to sensing a hazardous electrical condition.

BACKGROUND OF THE INVENTION

Electrical systems in residential, commercial and industrial applications usually include a panelboard for receiving electrical power from a utility source. The electrical power is then delivered from the panelboard to designated branch circuits supplying one or more loads. Typically, various types of protective devices are connected to the branch circuits to reduce the risk of injury, damage or fires. The protective devices may be mounted within the panelboard or external to the panelboard.

Circuit breakers are a well known type of protective device which are designed to trip open and interrupt an electric circuit in response to detecting overloads and short circuits. Overload protection is provided by a thermal element which, when heated by the increased current, will cause the circuit breaker to trip and interrupt the power. This can occur when too many loads draw power from the same branch circuit at the same time, or when a single load draws more power than the branch circuit is designed to carry. Short circuit protection is provided by an electromagnetic element that trips when sensing high current flow. Additionally, many circuit breakers include ground fault interruption (GFI) circuitry to protect against ground faults which occur when current flows from a hot conductor to ground through a person or object.

Arcing fault detectors are another type of protective device which may be employed in an electrical distribution system. Arcing fault detectors are designed to trip open and interrupt an electric circuit in response to arcing faults, which occur when electric current "arcs" or flows through ionized gas between two ends of a broken conductor, between two conductors supplying a load, or between a conductor and ground. Arcing faults typically result from corroded, worn or aged wiring or insulation, loose connections, wiring damaged by nails or staples through the insulation, and electrical stress caused by repeated overloading, lightning strikes, etc. The presence of an arcing fault creates a significant fire hazard because it generates heat which may ignite the conductor insulation and adjacent combustible materials. Standard circuit breakers typically can not detect arcing faults because branch or load impedance may cause the level of load current to be reduced below the trip curve setting of a standard circuit breaker.

Each branch circuit of the electrical distribution system may include a standard circuit breaker, an arcing fault detector and/or GFI circuitry to protect the branch circuit from associated hazardous conditions including overcurrents, arcing faults and ground faults. Although each respective protective device may be positioned virtually anywhere in the branch circuit, it is preferred that they be integrated within a common housing which may be positioned within an electrical distribution panelboard or load center. Where several protective devices are included in a common housing and the associated branch circuit is tripped open, there is a need to provide an indication to a user which one among the several fault conditions has caused the interruption of electrical power. Although trip indicators providing a visual indication of a circuit interruption are known in the art, they do not indicate which of the several fault conditions caused the circuit interruption. On the other hand, by providing a trip indicator capable of indicating that the circuit interruption was caused by the a particular fault condition, a user can easily ascertain the associated fault condition that caused the trip signal. The user can thereafter remedy the fault condition and reset the protective device before resupplying power to the load.

Accordingly, the present invention is directed to providing a visual trip indicator for a circuit protection device that satisfies or at least partially satisfies the aforementioned needs.

SUMMARY OF THE INVENTION

In accordance with one aspect of the present invention, there is provided a trip indicator for use in an electrical distribution system including a plurality of branch circuits each of which has line and neutral conductors for connecting a power source to a load. Each of the plurality of branch circuits includes an arcing fault detector disposed within a housing for detecting the occurrence of an arcing fault condition and activating a trip signal in response thereto and a line interrupter for disconnecting the load from the power source in response to the activation of the trip signal. The trip indicator comprises a light source adapted to illuminate in response to the activation of the trip signal. A conduit is provided within the housing for conveying light between the light source and an opening of the housing in response to illumination of the light source.

In accordance with another aspect of the present invention, there is provided a trip indicator for use in an electrical distribution system substantially as described above, in which the trip indicator comprises a plunger having a colored tip. The plunger is movable between a retracted position and an extended position in response to the activation of the trip signal. A conduit is provided within the housing for conveying light external to the housing toward the colored tip to produce a reflection of colored light. The conduit thereafter conveys the reflection of colored light to the opening of the housing.

In accordance with yet another aspect of the present invention, there is provided a trip indicator for use in an electrical distribution system substantially as described above, in which the trip indicator comprises a bimetal disk having a colored top. The bimetal disk is thermally movable between a generally flat position and a convex position in response to the activation of the trip signal. A conduit is provided within the housing for conveying light external to the housing toward the colored top to produce a reflection of colored light. The conduit thereafter conveys the reflection of colored light to the opening of the housing.

In accordance with still another aspect of the present invention, there is provided a trip indicator for use in an electrical distribution system substantially as described above, in which each of the plurality of branch circuits includes two or more protective devices. Each of the protective devices is adapted to detect the occurrence of respective fault conditions and activate a trip signal in response thereto. The trip indicator is responsive to the activation of the trip signal and indicates which of the respective protective devices activated the trip signal.

BRIEF DESCRIPTION OF THE DRAWINGS

In the drawings, which comprise a portion of this disclosure:

FIG. 7 is a top view of a miniature circuit breaker installed within the miniature circuit breaker housing of FIG. 6 in a closed (on) position and including a trip indicator according to one embodiment of the present invention;

FIG. 8 is a top view of a portion of the miniature circuit breaker of FIG. 7 in an open (off/tripped) position;

FIG. 9 is a side elevation of a trip indicator which may be positioned within the miniature circuit breaker housing of FIG. 6;

FIG. 11 is a side elevation of a trip indicator which may be positioned within the miniature circuit breaker housing of FIG. 6 according to still another embodiment of the present invention;

Figure 1:
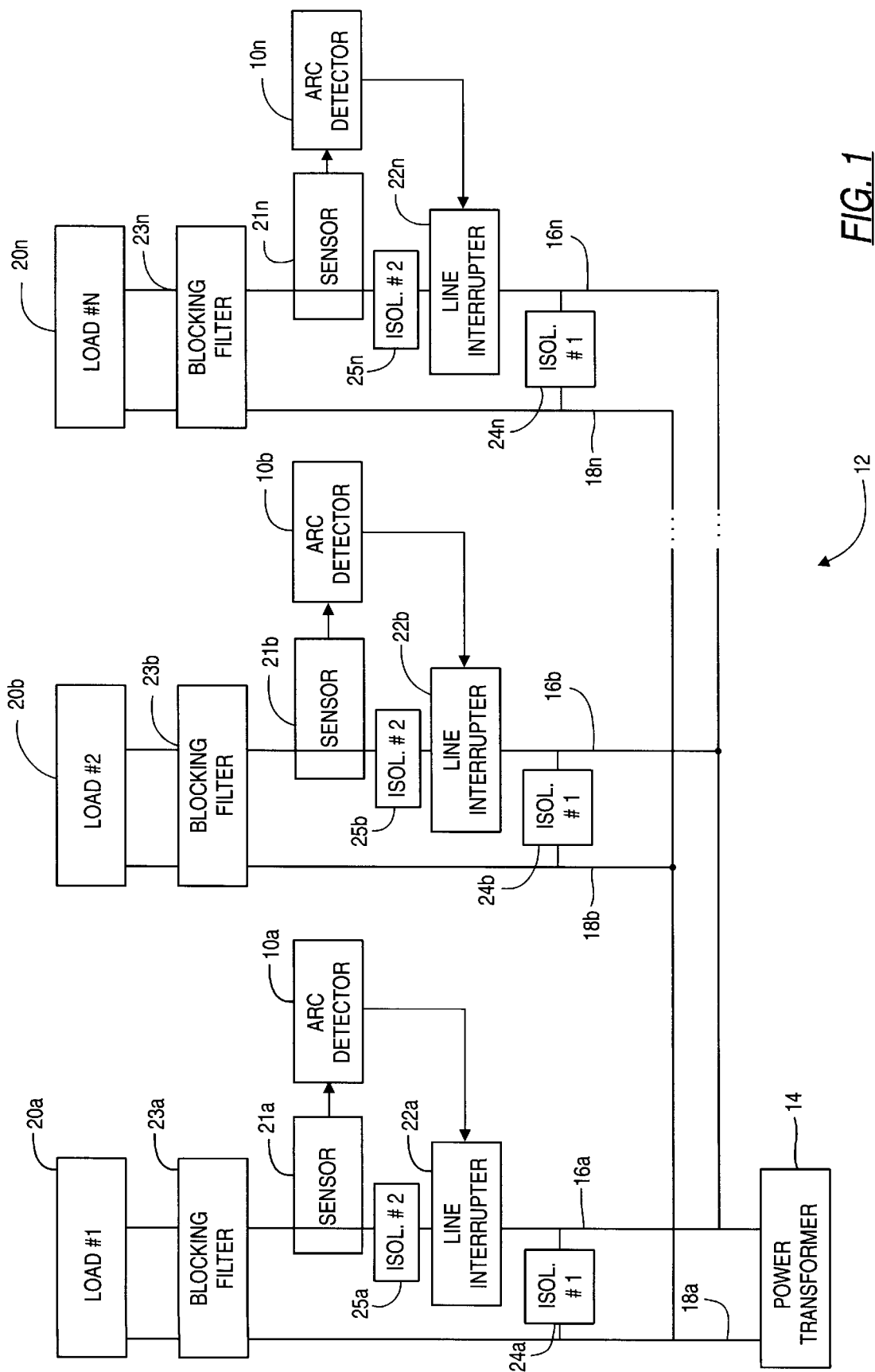
FIG. 1 is a block diagram of an arcing fault detector system which may be used to generate a trip signal in the present invention.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents, and alternatives falling within the spirit and scope of the invention as defined by the appended claims.

DESCRIPTION OF SPECIFIC EMBODIMENTS

Turning now to the drawings and referring initially to FIG. 1, arcing fault detectors $10a, 10b \ldots 10n$ are connected to n branches of an electrical distribution system 12 having a utility company power transformer 14 as a source of electric power. The electrical distribution system 12 includes line conductors $16a, 16b \ldots 16n$ and neutral conductors $18a, 18b \ldots 18n$ which distribute electrical power to loads $20a, 20b \ldots 20n$ through corresponding sensors $21a, 21b \ldots 21n$, line interrupters $22a, 22b \ldots 22n$, and blocking filters $23a, 23b \ldots 23n$. The line conductors 16 and a neutral conductors 18 are typically at 240 volts or 120 volts, and a frequency of 60 Hz.

Each of the line interrupters 22 is preferably a circuit breaker which includes an overload trip mechanism having a thermal/magnetic characteristic which trips the breaker contacts to an open circuit condition in response to a given overload condition, to disconnect the corresponding load 20 from the power source, as is known in the art. It is also known to provide the circuit breaker 22 with ground fault interrupter circuitry responding to a line or neutral-to-ground fault to energize a trip solenoid which trips the circuit breaker and opens the contacts.

The sensors 21 monitor the rate of change of electrical current in the respective line conductors 16 and produce signals representing the rate of change. The rate-of-change signal from each sensor 21 is supplied to the corresponding arcing detector 10, which produces a pulse each time the rate-of-change signal increases above a selected threshold. The rate-of-change signal and/or the pulses produced therefrom are filtered to eliminate signals or pulses outside a selected frequency range. The final pulses are then monitored to detect when the number of pulses that occur within a selected time interval exceeds a predetermined threshold. In the event that the threshold is exceeded, the detector 10 generates an arcing-fault-detection signal that can be used to trip the corresponding line interrupter 22.

The pattern of fluctuations in the rate-of-change signal produced by the sensor 21 indicates whether the condition of the circuit is a normal load, a normal switching event, a phase-controlled fired load, or an arcing fault event. One example of a suitable sensor for producing the desired rate-of-change signal is a toroidal sensor having an annular core encompassing the current-carrying load line, with the sensing coil wound helically on the core. The core is made of magnetic material such as a ferrite, iron, or molded permeable powder capable of responding to rapid changes in flux. A preferred sensor uses a ferrite core wound with 200 turns of 24–36 gauge copper wire to form the sensing coil. An air gap may be cut into the core to reduce the permeability to about 30. The core material preferably does not saturate during the relatively high currents produced by parallel arcs, so that arc detection is still possible at those high current levels.

Other means for sensing the rate of change of the current in a line conductor are contemplated by the present invention. By Faraday's Law, any coil produces a voltage proportional to the rate of change in magnetic flux passing through the coil. The current associated with an arcing fault generates a magnetic flux around the conductor, and the coil of the sensor 21 intersects this flux to produce a signal. Other suitable sensors include a toroidal transformer with a core of magnetic material or an air core, an inductor or a transformer with a laminated core of magnetic material, and inductors mounted on printed circuit boards. Various configurations for the sensor core are contemplated by the present invention and include toroids which have air gaps in their bodies.

Preferably, the rate-of-change signal produced by the sensor 21 represents only fluctuations in the rate of change within a selected frequency band. The sensor bandpass characteristic is preferably such that the lower frequency cut-off point rejects the power frequency signals, while the upper frequency cut-off point rejects the high frequency signals generated by noisy loads such as a solder gun, electric saw, electric drill, or like appliances, equipment, or tools. The resulting output of the sensor 21 is thus limited to the selected frequency band associated with arcing faults, thereby eliminating or reducing spurious fluctuations in the rate-of-change signal which could result in nuisance tripping. As an example, the sensor bandpass characteristic may have: (1) a lower frequency cutoff point or lower limit of 60 Hz so as to reject power frequency signals, and (2) an upper frequency cut-off point or upper limit of approximately 1 MHz so as to effectively reject high frequency signals associated with noisy loads. These specific frequency cut-off points for the sensor bandpass characteristic are by way of example only, and other appropriate frequency cut-off limits may be adopted depending upon actual frequency ranges for the power signals as well as the noisy load signals.

The desired bandpass characteristic is realized by appropriately selecting and adjusting the self-resonant frequency of the sensor. The current-type sensor is selected to have a predetermined self-resonant frequency which defines associated upper and lower frequency cut-off or roll-off points for the operational characteristics of the sensor. Preferably, the current-type sensor is designed to exhibit the desired bandpass filtering characteristic as it operates to detect the rate of change of current variations within the load line being monitored. The present invention contemplates other means for bandpass filtering the signal output within the selected frequency band. For example, a bandpass filter or a combination of filters in a circuit can be used to attenuate frequencies above or below the cut-off points for the selected frequency band.

Figure 2:
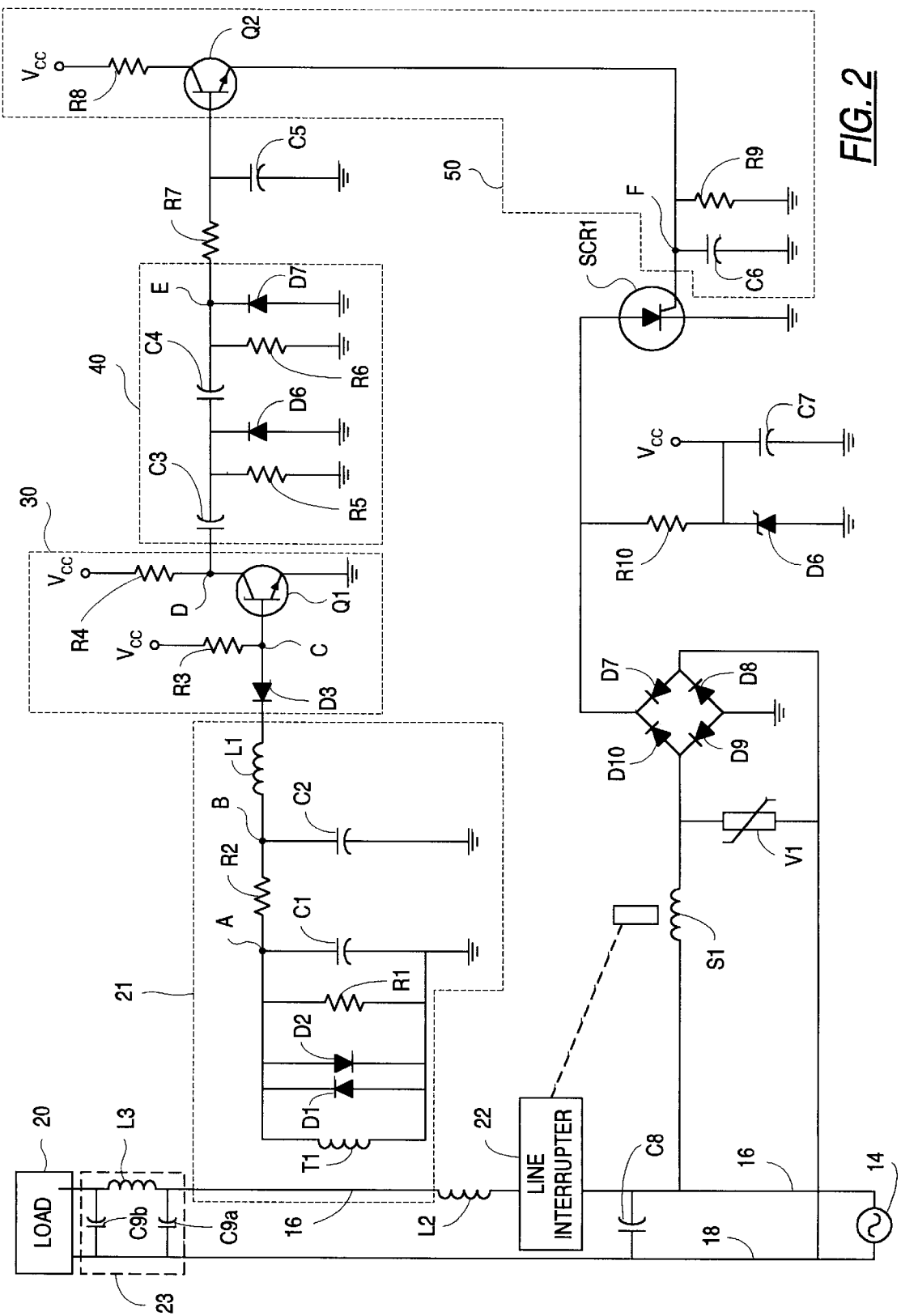
FIG. 2 is a schematic diagram of an electrical circuit for implementing the arcing fault detector system illustrated in FIG. 1.

FIG. 2 illustrates a preferred circuit for one of the arc detectors 10. The sensor 21 produces the desired rate-of-change signal (commonly referred to as a "di/dt signal") in the form of an output voltage which is connected to a comparator circuit 30 through a filtering network in the sensor and a diode D3. The rate-of-change signal originates in the sensor coil T1 which is wound on a core surrounding the load line 16. Connected in parallel with the sensor coil T1 are a pair of diodes D1 and D2 which serve as clamping devices during high-power transient conditions. A resistor R1 in parallel with the diodes D1 and D2 dampens self-ringing of the sensor, during high-power transients. A pair of capacitors C1 and C2 in parallel with the resistor R1, and a resistor R2 and an inductor L1 connected in series to the input to the comparator 30, are tuned to assist in attaining the desired rolloff characteristics of the filtering network formed thereby. For example, with the illustrative values listed below for the components of the circuit of FIG. 2, the sensor has a passband extending from about 10 KHz to about 100 KHz, with sharp rolloff at both sides of the passband.

Figure 3A:
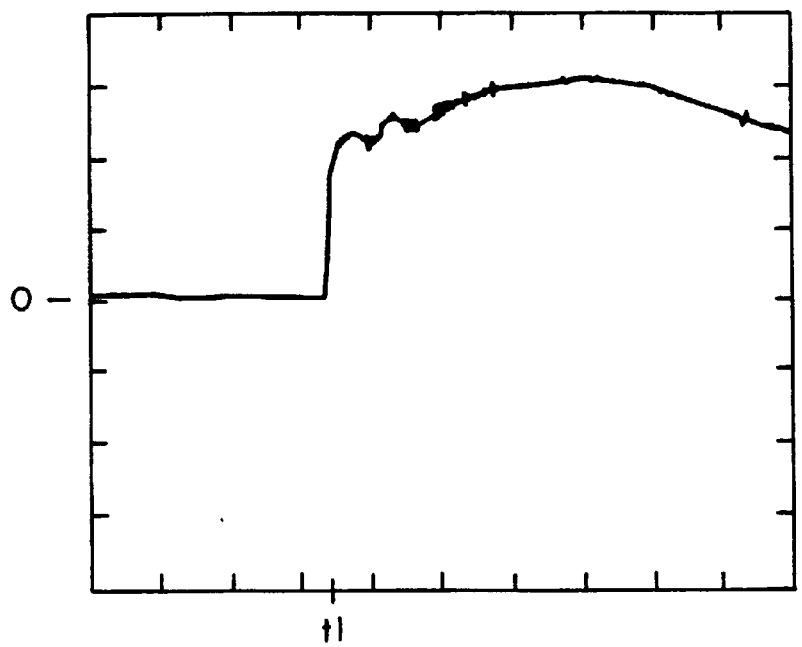
FIGS. 3a through 3g are waveforms at various points in the circuit of FIG. 2.
Figure 3B:
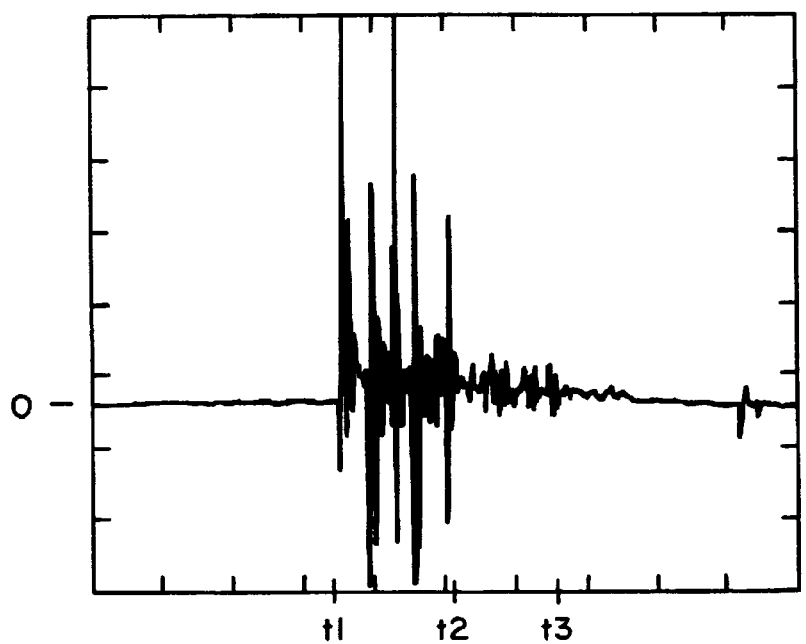

The operation of the circuit of FIG. 2 can be more clearly understood by reference to the series of waveforms in FIGS. 3a through 3g. FIG. 3a is an actual waveform from an oscilloscope connected to a line conductor 16 carrying a-c. power at 60 Hz and experiencing a high-frequency disturbance beginning at time t1. Because the high-frequency disturbance is within the frequency range to which the sensor 21 is sensitive (e.g., from about 10 KHz to about 100 KHz), the disturbance results in a burst of high-frequency noise in the di/dt output signal (FIG. 3b) from the sensor 21 (at point A in the circuit of FIG. 2), beginning at time t1. The noise burst has a relatively high amplitude from time t1 until approximately time t2, and then continues at a low amplitude from time t2 to about time t3.

In the comparator 30, the magnitude of the rate-of-change signal from the sensor 21 is compared with the magnitude of a fixed reference signal, and the comparator 30 produces an output voltage only when the magnitude of the rate-of-change signal crosses that of the reference signal. This causes the detector 10 to ignore low-level signals generated by the sensor 21. All signals having a magnitude above the threshold level set by the magnitude of the reference signal are amplified to a preset maximum value to reduce the effect of a large signal. In the comparator 30, a transistor Q1 is normally turned on with its base pulled high by a resistor R3. A diode D3 changes the threshold and allows only the negative pulses from the sensor 21 to be delivered to the base of transistor Q1. When the signal to the comparator drops below the threshold level (minus 0.2 volt for the circuit values listed below), this causes the transistor Q1 to turn off. This causes the collector of the transistor Q1 to rise to a predetermined voltage, determined by the supply voltage $V_{cc}$, a resistor R4 and the input impedance of a single-shot pulse generator circuit 40. This collector voltage is the output of the comparator circuit 30. The collector voltage remains high as long as the transistor Q1 is turned off, which continues until the signal from theسnsor 21 rises above the threshold level again. The transistor Q1 then turns on again, causing the collector voltage to drop. The end result is a pulse output from the comparator, with the width of the pulse corresponding to the time interval during which the transistor Q1 is turned off, which in turn corresponds to the time interval during which the negative-going signal from the sensor 21 remains below the threshold level of the comparator.

The arcing fault detection system 10 can also include a filter 40 for blocking false arcing fault signals or other nuisance output signals generated by normal operation of the load 20. The blocking filter 40 is connected between the sensor 30 and the load 20 on each branch circuit to prevent the false arcing fault signals from being delivered to the sensor 30. As seen in FIG. 1, capacitors 42 connect the load line 24 to the neutral line 26 on each branch circuit. An inductor 44 is connected to the load line 24 between the connections of the two capacitors 42 to the load line 24.

Figure 3C:
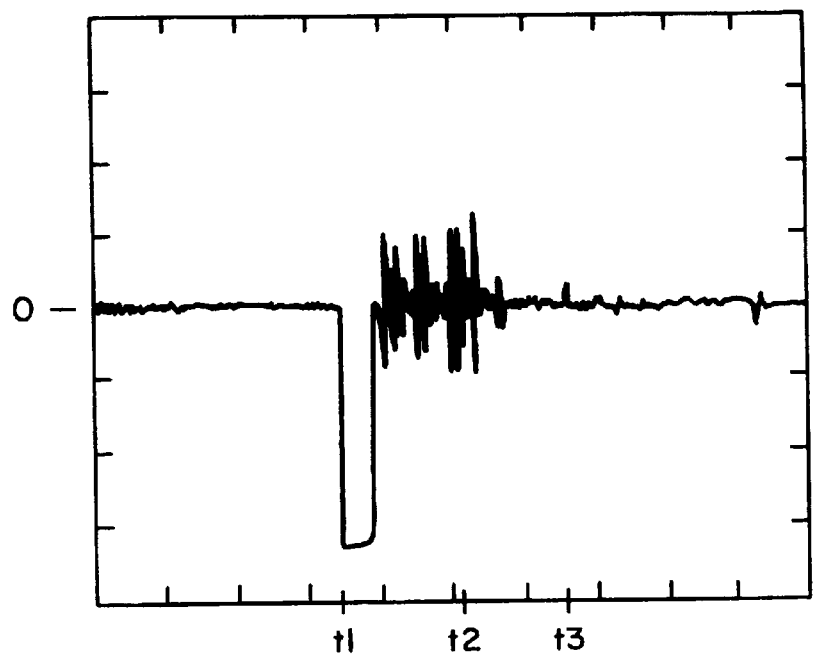
Figure 3D:
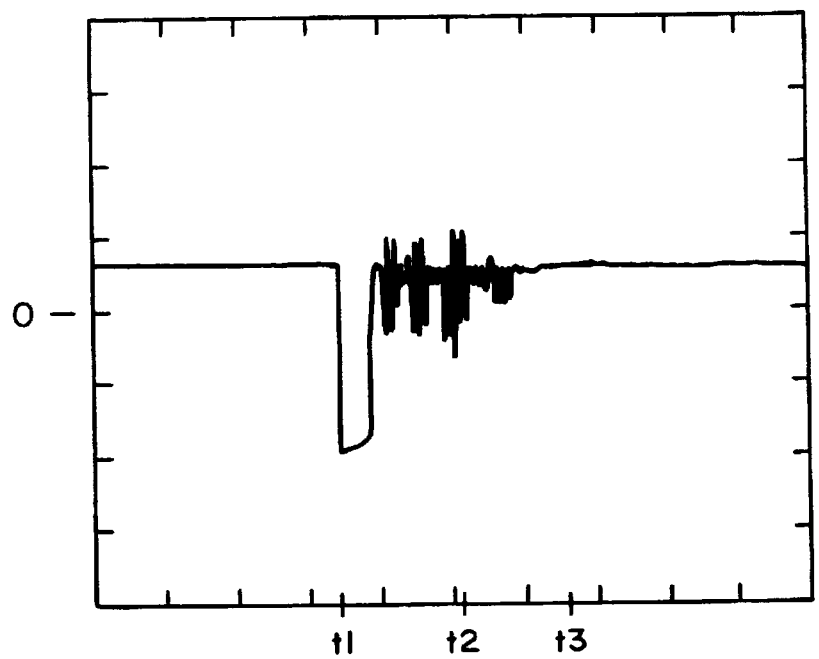

The noise burst in the sensor output is filtered to produce the waveform shown in FIG. 3c at point B in the circuit of FIG. 2. The waveform at point C in the circuit of FIG. 2 is shown in FIG. 3d, and it can be seen that the amplitude has been reduced and a d-c. offset has been introduced by summing the filtered di/dt signal with a d-c. bias from the supply voltage $V_{cc}$ at point C. This is the input signal to the base of the transistor Q1.

Figure 3E:
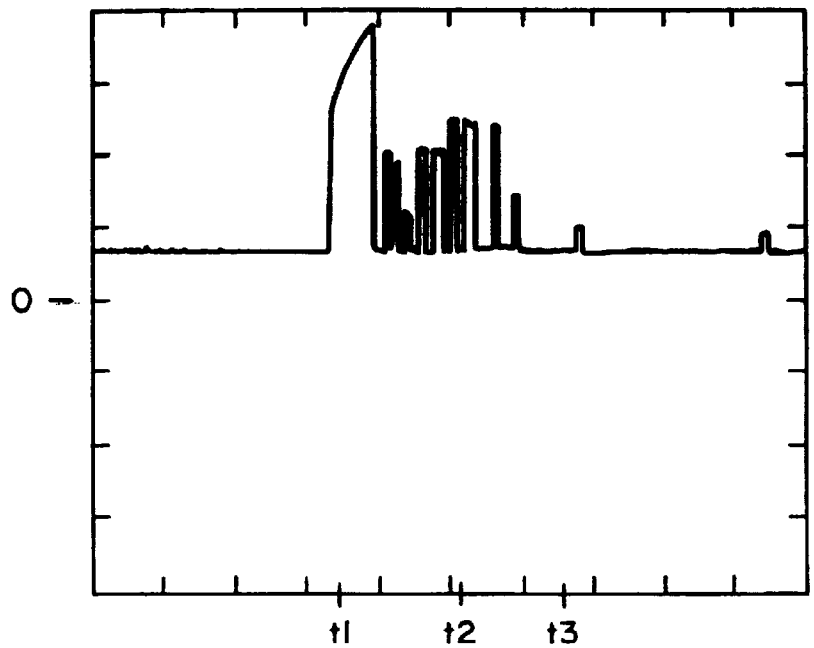

The output of the transistor Q1 is a series of positive-going pulses corresponding to the negative-going peaks in the input signal. The transistor output, at point D in the circuit of FIG. 2, is shown in FIG. 3e. It can be seen that the transistor circuit functions as a comparator by producing output pulses corresponding only to negative-going peaks that exceed a certain threshold in the filtered di/dt signal shown in FIG. 3c. At this point in the circuit, the pulses vary in both width and amplitude, as can be seen in FIG. 3e.

To convert the output pulses of the comparator 30, which vary in both width and amplitude, into a series of pulses of substantially constant width and amplitude, the comparator output is fed to a single-shot pulse generator circuit 40. This high-pass filter circuit includes a pair of capacitors C3 and C4 connected in series to the collector of the transistor Q1, and two resistor-diode pairs connected in parallel from opposite sides of the capacitor C4 to ground. The pulses produced by this circuit will be described in more detail below in connection with the waveforms shown in FIG. 3. The output pulses are predominantly pulses of equal width and amplitude, although occasional larger or smaller pulses can result from especially large or small input pulses.

Figure 3F:
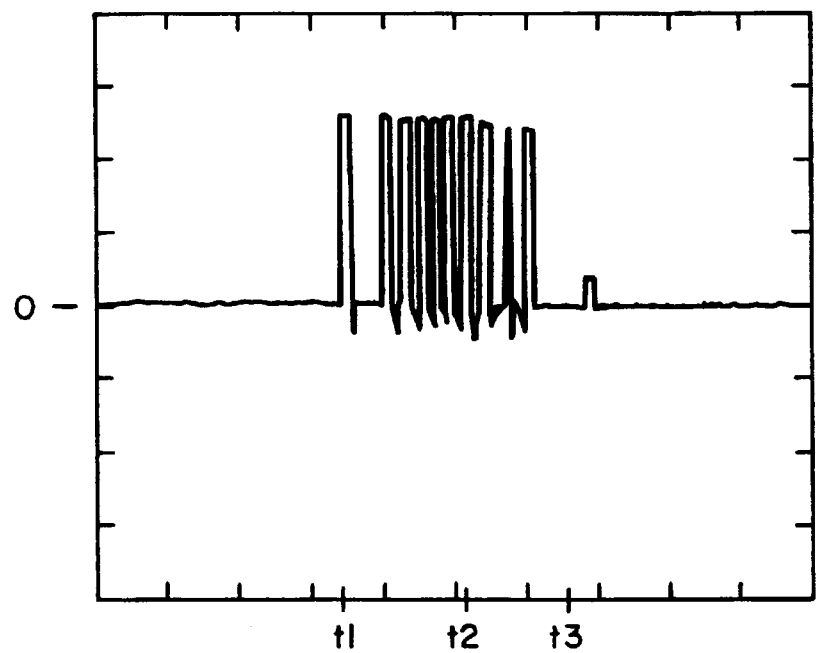

The variable-width and variable-amplitude pulses of FIG. 3e are converted to a series of pulses of substantially constant width and amplitude by the single-shot pulse generator circuit 40. The output of this circuit 40, at point E in the circuit of FIG. 2, is shown in FIG. 3f. Although all the pulses shown in FIG. 3f are of substantially the same size, larger or smaller pulses may be produced by di/dt spikes that are excessively large or excessively small. The vast majority of the pulses at point E, however, are substantially independent of the amplitude and duration of the corresponding spikes in the di/dt signal, provided the spikes are large enough to produce an output pulse from the comparator 30.

The substantially uniform pulses produced by the circuit 40 are supplied to the base of a transistor Q2 through a current-limiting resistor R7. A capacitor C5 connected from the transistor base to ground improves the sharpness of the roll-off of the bandpass filtering. The transistor Q2 is the beginning of an integrator circuit 50 that integrates the pulses produced by the circuit 40. The pulses turn the transistor on and off to charge and discharge a capacitor C6 connected between the transistor emitter and ground. A resistor R9 is connected in parallel with the capacitor C6, and a resistor R8 connected between the supply voltage and the collector of the transistor Q2 determines the level of the charging current for the capacitor C6. The magnitude of the charge on the capacitor C6 at any given instant represents the integral of the pulses received over a selected time interval. Because the pulses are substantially uniform in width and amplitude, the magnitude of the integral at any given instant is primarily a function of the number of pulses received within the selected time interval immediately preceding that instant. Consequently, the value of the integral can be used to determine whether an arcing fault has occurred.

Figure 3G:
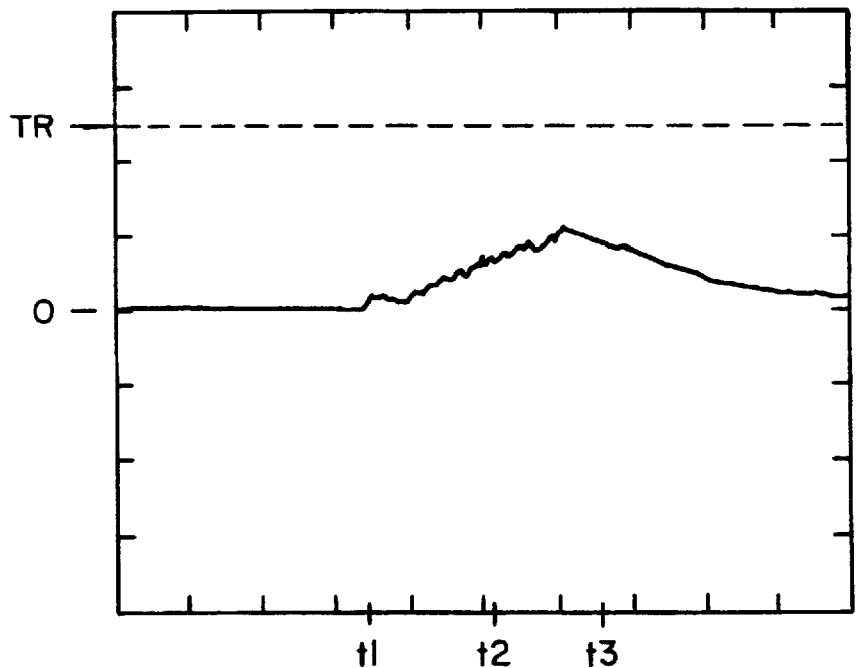

The integral signal produced by the circuit 50 is shown in FIG. 3g, taken at point F in the circuit of FIG. 2. It can be seen that the integrator circuit charges each time it receives a pulse from the circuit 40, and then immediately begins to discharge. The charge accumulates only when the pulses appear at a rate sufficiently high that the charge produced by one pulse is less than the discharge that occurs before the next pulse arrives. If the pulses arrive in sufficient number and at a sufficient rate to increase the integral signal to a trip threshold level TR (FIG. 3g), SCR1 is triggered to trip the circuit breaker. The circuit is designed so that this occurs only in response to a di/dt signal representing an arcing fault.

When SCR1 is turned on, a trip solenoid S1 is energized to disconnect the load from the circuit in the usual manner. Specifically, turning on SCR1 causes current to flow from line to neutral through a diode bridge formed by diodes D7–D10, thereby energizing the solenoid to open the circuit breaker contacts in the line 16 and thereby disconnect the protected portion of the system from the power source. The d-c. terminals of the diode bridge are connected across SCR1, and the voltage level is set by a zener diode D6 in series with a current-limiting resistor R10. A varistor V1 is connected across the diode bridge as a transient suppressor. A filtering capacitor C7 is connected across the zener diode D6. The trip circuit loses power when the circuit breaker contacts are opened, but of course the contacts remain open until reset.

One example of a circuit that produces the desired result described above is the circuit of FIG. 2 having the following values:

| | |
|---|---|
| D1 | 1N4148 |
| D2 | 1N4148 |
| D3 | 1N4148 |
| D4 | 1N4148 |
| D5 | 1N4148 |
| D6 | 27v zener |
| R1 | 3.01K |
| R2 | 1.3K |
| R3 | 174K |
| R4 | 27.4K |
| R5 | 10K |
| R6 | 10K |
| R7 | 10K |
| R8 | 4.2K |
| R9 | 4.75K |
| R10 | 24K |
| L1 | 3300 $\mu$H |
| L2 | 500 $\mu$H |
| L3 | 500 $\mu$H |
| C1 | 0.012 $\mu$F |
| C2 | 0.001 $\mu$F |
| C3 | 0.001 $\mu$F |
| C4 | 0.001 $\mu$F |
| C5 | 0.001 $\mu$F |
| C6 | 6.8 $\mu$F |
| C7 | 1.0 $\mu$F |
| C8 | 1.0 $\mu$F |
| Q1 | 2N2222A |
| Q2 | 2N2222A |
| SCR1 | CR08AS-12 made by POWEREX-Equal |
| VCC | 27v |

Although a circuit breaker is the most commonly used line interrupter, the output device may be a comparator, SCR, relay, solenoid, circuit monitor, computer interface, lamp, audible alarm, etc.

It will be understood that a number of modifications may be made in the circuit of FIG. 2. For example, the discrete bandpass filter between the sensor and the comparator can be replaced with an active filter using an operational amplifier. As another example, a single-shot timer can be used in place of the single-shot pulse generator in the circuit of FIG. 2. This circuit can receive the output signal from an active filter as the trigger input to an integrated-circuit timer, with the output of the timer supplied through a resistor to the same integrator circuit formed by the resistor R9 and capacitor C6 in the circuit of FIG. 2.

Figure 4:
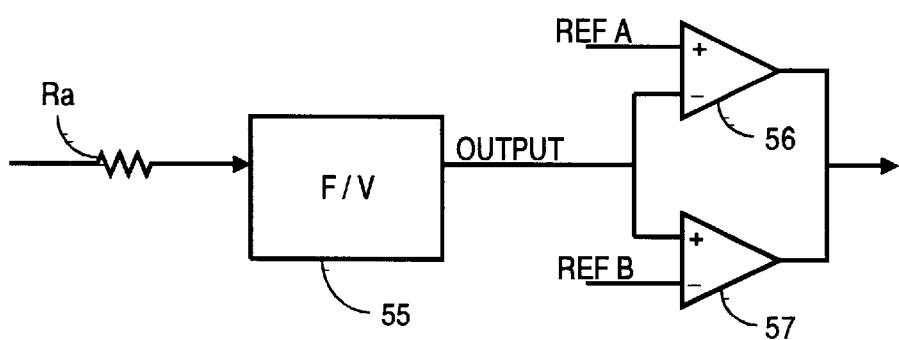
FIG. 4 is a schematic diagram of an alternate circuit for use in place of the comparator and single-shot pulse generator in the circuit of FIG. 2.

FIG. 4 illustrates a frequency-to-voltage converter circuit that can be used in place of all the circuitry between point A and the integrator circuit in FIG. 2. In this circuit, the signal from point A in FIG. 2 is supplied through a resistor Ra to a frequency/voltage converter integrated circuit 55 such as an AD537 made by Analog Devices Inc. The output of the integrated circuit 55 is fed to a pair of comparators 56 and 57 that form a conventional window comparator. Specifically, the output of the circuit 55 is applied to the inverting input of a comparator 56 and to the non-inverting input of a comparator 57. The other inputs of the comparators 56 and 57 receive two different reference signals A and B which set the limits of the window, i.e., the only signals that pass through the window comparator are those that are less than reference A and greater than reference B.

Figure 5:
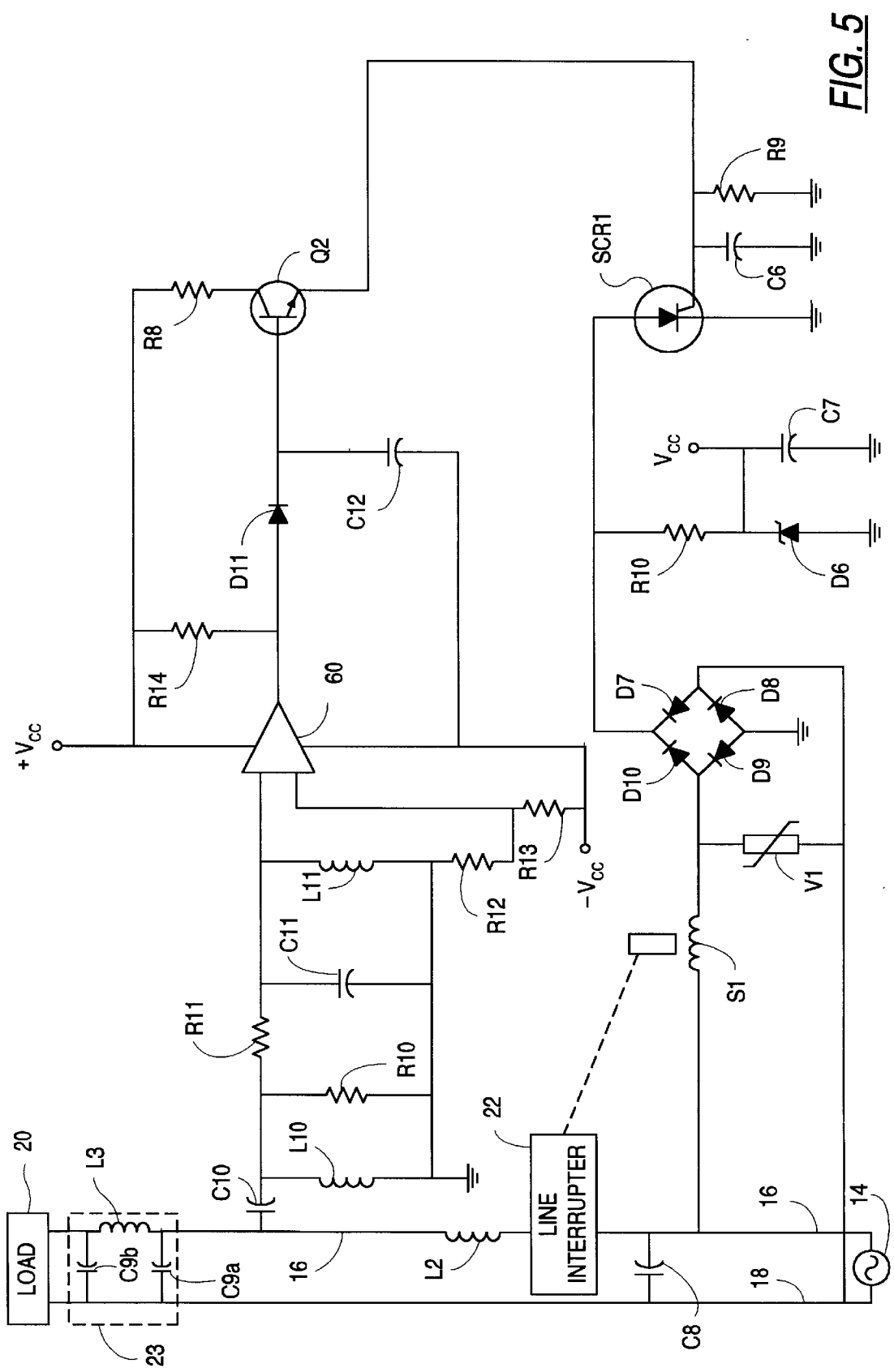
FIG. 5 is a schematic diagram of an alternative circuit for implementing the arcing fault detection system illustrated in FIG. 1.

FIG. 5 illustrates an arc detector 10 for sensing the rate of change of the line voltage, i.e., dv/dt, rather than current.

The sensor in this circuit is a capacitor C10 connected between a line conductor 16 and an inductor L10 leading to ground. The inductor L10 forms part of a bandpass filter that passes only those signals falling within the desired frequency band, e.g., between 10 KHz and 100 KHz. The filter network also includes a resistor R10, a capacitor C11 and a second inductor L11 in parallel with the first inductor L10, and a resistor R11 connected between the resistor R10 and the capacitor C11. The resistor R11 dampens the ringing between the capacitor C10 and the inductor L10, and the resistor R11 adjusts the threshold or sensitivity of the circuit. The inductors L10 and L11 provide low-frequency roll-off at the upper end of the pass band, and a capacitor C11 provides the high-frequency roll-off at the lower end of the pass band.

The capacitor C10 may be constructed by attaching a dielectric to the line bus so that the bus forms one plate of the capacitor. The second plate of the capacitor is attached on the opposite side of the dielectric from the bus. The sensor circuit is connected to the second plate.

The output of the bandpass filter described above is supplied to a comparator 60 to eliminate signals below a selected threshold, and to limit large signals to a preselected maximum amplitude. The filter output is applied to the inverting input of the comparator 60, through the resistor R11, while the non-inverting input receives a reference signal set by a voltage divider formed by a pair of resistors R12 and R13 connected between $V_{cc}$ and ground. The comparator 60 eliminates very low levels of signal received from the sensor. The comparator 60 is normally off when there is no arcing on the line conductor 16, and thus the comparator output is low. When the voltage signal from the sensor is more negative than the reference input (e.g., –0.2 volts), the output from the comparator goes high, and a forward bias is applied to the transistor Q2 that drives the integrator circuit. A capacitor C12 connected from the base of transistor Q2 to $-V_{cc}$ filters out high frequency noise. A diode D11 is connected between the comparator output and the base of the transistor Q2 to block negative signals that would discharge the capacitor C12 prematurely. The rest of the circuit of FIG. 5 is identical to that of FIG. 2.

When a fault occurs, it is desirable to isolate the branch of the distribution system in which the arcing fault occurred, from the rest of the distribution system. In the system of FIG. 1, using the current-type sensor, such isolation is provided by a capacitor C8 connected between the load line 16 and the neutral line 18 in each branch of the distribution system. The capacitor C8 is located between the line interrupter 22 and the power source 14 to provide a low impedance path for an arcing fault from the load line 16 to the neutral line 18, independent of the impedance of the load 20. The capacitor C8 thus prevents a series path from being created between branch circuits, even though the power transformer 14 appears as a high impedance to the high frequency current that an arcing fault generates.

The isolating capacitor C8 allows the sensor 21 to be sensitive even when all the loads are off-line and the impedance is high. As the loads come on-line, the impedance decreases. Without the isolating capacitor C8, a series path could be created between branch circuits. For example, current flow along the neutral line of a first branch circuit, within which an arcing fault is generated, could travel along the load line of the first branch circuit. The current could then continue through the load line of second branch circuit, subsequently flowing along the neutral line of the second branch circuit. The isolating capacitor C8 prevents this pathway between branch circuits from being formed.

With the voltage-type sensor shown in FIG. 5, isolation is provided by an inductor L2 in the load line 16 for each branch circuit. Each inductor L2 is located between the line interrupter 22 and the sensor 21 to provide an impedance for the current produced by an arcing fault.

The isolating capacitors C8 and the isolating inductors L2 may be used simultaneously in their respective positions in the branch circuits. This combination can be particularly useful if the sensors monitor both the current and voltage changes in the branch circuits to detect arcing faults.

The arcing fault detection system also includes a blocking filter 23 in each branch circuit for blocking false arcing fault signals or other nuisance output signals generated by normal operation of the load 20. Each blocking filter 23 is connected between the sensor 21 and the load 20 in each branch circuit to prevent false arcing fault signals from being delivered to the sensor 21. As seen in FIGS. 2 and 5, the preferred blocking filter includes a pair of capacitors C9a and C9b connected between the load line 16 and the neutral line 18 of each branch circuit. An inductor L3 is connected in the load line 16 between the two capacitors C9a and C9b. Preferably, the capacitors C9a and C9b have a rating across the line of about 0.47 uF. The inductor L3 has a rating for 15 amps at 500 uH and dimensions of about 1.5" diameter and 1.313" in length (e.g., Dale IHV 15–500). These values, of course, can be adjusted for the power rating of the electrical system and the loads 20.

The capacitor C9a creates a low impedance path for any series arcing that occurs upstream of that capacitor, such as arcing within the wall upstream of a noisy load. This permits series arcing to be detected in the branch containing the blocking filter. The inductor L3 creates an impedance that does most of the attenuation of the signal created by a noisy load. This inductor is sized to carry the load current of the device, which is typically 15 or 20 amperes. The second capacitor C9b reduces the amount of inductance required in the inductor L3, by creating a low impedance path across the load 20.

One of the advantages of the blocking filter 23 is that it can be used locally on a particular branch circuit that is known to connect to a load 20 which is noisy. The expense of using the blocking filter 23 is reduced since it can be used only where needed. The blocking filter 23 also allows easy retrofitting to existing electrical distribution systems in residences and commercial space.

Although the above system has been described in connection with an ordinary 120 volt system, it is applicable to the voltages of any standard, including 12, 120, 240, 480, 600 and 18500 volts. The system is suitable for use in residential, commercial and industrial applications, single-shot or multiphase systems and at all frequencies for a-c. as well as d-c. This system is applicable to automotive, aviation, and marine needs, separately derived sources such as generators or UPS, and capacitor banks needing incipient fault protection.

Although the above system has been illustrated with circuit breakers, it can also be used with circuit/load monitoring devices, motor monitoring devices, receptacles, cord plugs, portable diagnostic devices, appliances, switches and fuses.

One of the many application of the above system is its use with ground fault circuit interrupters (GFCI's). An example of a ground fault interrupter is a fast acting circuit breaker that disconnects equipment from the power line when some current returns to the source through a ground path. Under normal circumstances all current is supplied and returned within the power conductors. But if a fault occurs and leaks some current to ground, the GFCI senses the difference in current in the power conductors. If the fault level exceeds the trip level of the GFC1, which is usually at about 6 mA, the GFCI disconnects the circuit.

Three types of GFCI are commonly available. The first or separately enclosed type is available for 120-volt, 2-wire and 12/240-volt, 3-wire circuits up to 30 amp. The second type combines a 15-, 20-, 25-, or 30-amp circuit breaker and a GFCI in the same plastic case. It is installed in place of an ordinary breaker in a panelboard and is usually available in 120-volt, 2-wire, or 120/240-volt, 3-wire types which may also be used to protect a 240-volt, 2-wire circuit. The second type provides protection against ground faults and overloads for all outlets on the circuit. A third type having a receptacle and a GFCI in the same housing provides only ground-fault protection to the equipment plugged into that receptacle. There are feed-through types of GFCI which provide protection to equipment plugged into other ordinary receptacles installed downstream on the same circuit.

Ground fault equipment is commercially available from the Square D Company under the catalog designations GROUND CENSOR™, HOMELINE®, QO®, TRILLIANT® and MICROLOGIC® ground fault modules. This ground fault equipment is suitable for protection of main, feeder, and motor circuits on electrical distribution systems. It is also usable as ground fault relay and ground fault sensing devices. The arc detection systems described above can be advantageously used to supplement the circuit protection provided by all the foregoing types of GFCIs.

The term arcing fault, as used herein, includes faults caused by either series arcs (both line and neutral) or parallel arcs (line to line, line to ground, or line to neutral). The term arc, as used herein, includes not only a discharge of electricity through a gas or across an insulating medium, but also high impedance faults or other intended or unintended circuit paths which do not have sufficient energy or current flow to trip a breaker, but nevertheless can generate damaging heat or other undesirable effects.

The term mutual inductance, as used herein, is the property shared by neighboring inductors or inductive devices which enables electromagnetic induction to take place. The term rate of current or voltage change, as used herein, measures the change the current or voltage over the period in time corresponding to the measurement. The current generates a flux around the conductor which rapidly changes with the fluctuations in current.

The term panelboard, as used herein, designates an electrical distribution device having a current capacity to accommodate residential, commercial and industrial uses.

Figure 6:
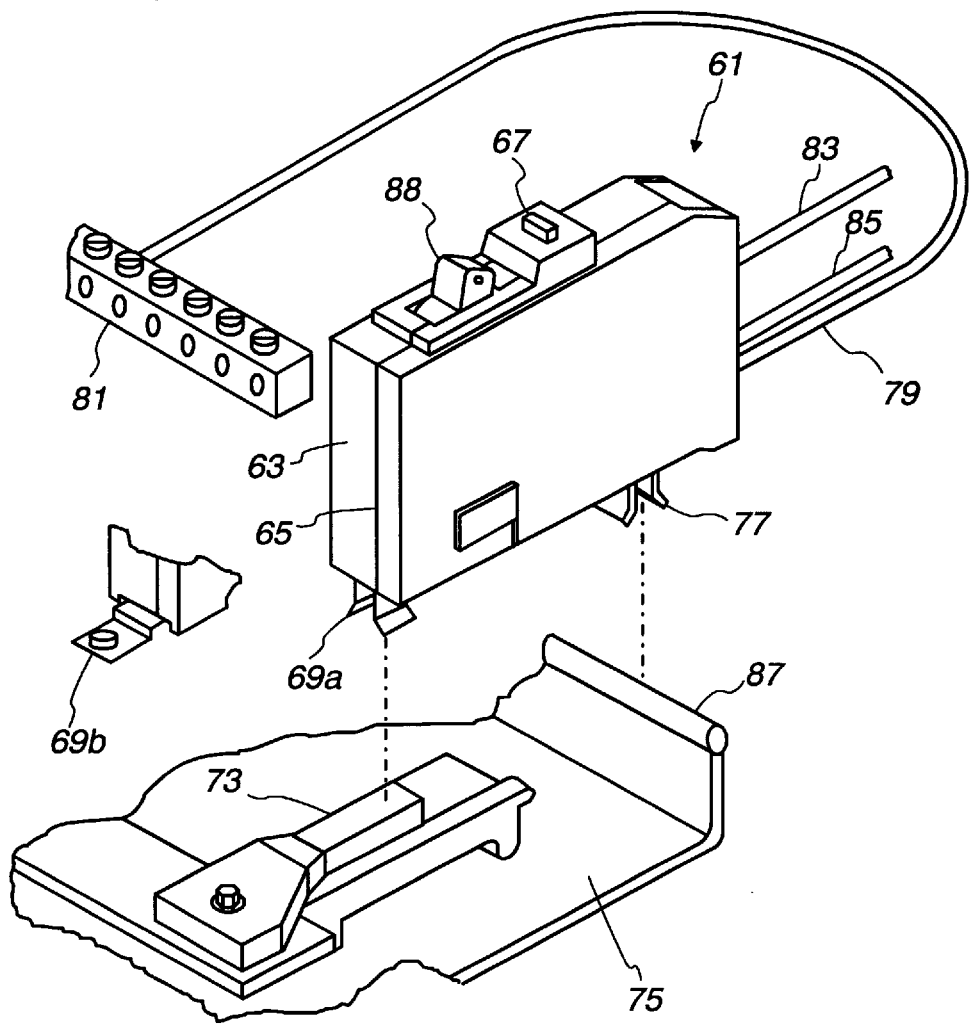
FIG. 6 is a perspective view of a miniature circuit breaker housing which may be mounted to a panelboard and which may include the arcing fault detection system of FIG. 1.

Referring now to FIG. 6, there is depicted a perspective view of a miniature circuit breaker housing generally designated by reference numeral 61. The miniature circuit breaker housing 61 is comprised of an electrically-insulating base 63 closed at one face by a detachable cover 65 which together enclose the components of a miniature circuit breaker, which may comprise a standard circuit breaker, a ground fault interrupter module, an arcing fault detection system or any combination thereof. In embodiments including an arcing fault detection system, the arcing fault detection system will preferably be that described in relation to FIG. 1, but it will be appreciated that alternative types of arcing fault detection systems may be enclosed within the miniature circuit breaker housing 61. A clip 77 is provided for mounting the housing 61 to a mounting bracket 87 of a panelboard 75 of an electrical distribution system. An electrically-conductive jaw-like terminal 69a or bolt terminal 69b extends through the base 63 to be externally connected to a line bus bar 73 within the panelboard 75. Similarly, a panel neutral conductor 79 extends through the housing 61 for connection to a neutral bar 81 in the panelboard 75. External connections to the line and neutral conductors leading to a load center of a branch circuit of the electrical distribution system are provided through a load line conductor 83 and load neutral conductor 85, respectively. An operating handle 88 and test button 67 are mounted through separate openings in the base 63 for external manual operation of the miniature circuit breaker.

Turning now to FIG. 7, there is provided a diagram of a miniature circuit breaker 22 adapted to be housed within the miniature circuit breaker housing of FIG. 6 including standard circuit breaker components and an arcing fault detection system according to one embodiment of the present invention. As depicted in FIG. 7, the miniature circuit breaker 22 is in a closed position, enabling line current to flow completely through the circuit breaker and toward a load center of a designated branch circuit. Line current enters the circuit breaker 22 through the jaw-like terminal 69a and flows through a stationary contact carrier 62 integral with the terminal 69a. The stationary contact carrier 62 has a stationary contact 66 mounted thereon. When in the closed position, the stationary contact 66 abuts against a movable contact 68 which is mounted to a movable contact carrier 64. Line current thereby flows from the stationary contact carrier 62 to the movable contact carrier 64 through the stationary and movable contacts 66 and 68, respectively.

A pigtail conductor 89 is electrically connected at one end to the movable contact carrier 64 and at another end to a yoke 72, enabling line current to flow from the movable contact carrier 64 to the yoke 72 when the circuit breaker 22 is in a closed position. A bimetal conductor assembly 90 composed of two dissimilar thermostat materials 90a and 90b is electrically connected to the yoke 72. The bimetal conductor assembly 90 includes a conductive plate 91 at one end which is electrically connected to an internal conductor 93. When the circuit breaker 22 is in the closed position, electrical current flows from the yoke 72 through the bimetal conductor assembly 90 to the conductive plate 91 and through the internal conductor 93. Thereafter, current flowing through the internal conductor 93 passes through a sensing coil 21 substantially as described in relation to FIG. 1 which monitors the rate of change of electrical current flowing through the circuit breaker 22. After exiting the sensing coil 21, the line current flows to load terminal block 70 to which the load line conductor 83 (FIG. 6) may be attached to provide the line current to a load. The load terminal block 70 is defined by two conductive plates adapted to be clamped together by a screw. The load line conductor 83 may be attached by inserting it between two conductive plates and tightening the screw of the load terminal block 70.

The miniature circuit breaker 22 also includes a neutral terminal block 71 to which the load neutral conductor 85 (FIG. 6) may be attached in a similar fashion as the load line conductor 83 is attached to the load terminal block 70. The miniature circuit breaker further includes an internal neutral conductor 103 electrically connected at one end to the circuit board 96 and at another end to the panel neutral conductor 79 described in relation to FIG. 6. In embodiments with ground fault interruption (GFI) circuitry, the panel neutral conductor 79 is routed through the sensor 21 along with the internal line conductor 93 to permit sensing of an imbalance of current flow between the internal line and neutral conductors 93 and 103 as is known in the art. A more complete description of GFI circuitry is disclosed in U.S. Pat. No.

5,446,431, assigned to the instant assignee and incorporated herein by reference.

Now turning to FIG. 8, the miniature circuit breaker 22 is shown in an open position. In the open position, the movable contact carrier 64 is rotated away from the stationary contact carrier 62, causing the movable contact 68 to become separated from the stationary contact 66 and interrupt the electric current flowing through the circuit breaker 22. The circuit breaker 22 may be tripped open in any of several ways, including manual control and in response to thermally and electromagnetically-sensed overload conditions and ground fault conditions. As the mechanism for tripping open the circuit breaker 22 is described in detail in U.S. Pat. No. 5,446,431, it will be described only briefly herein.

The miniature circuit breaker 22 may be moved between the open and closed positions by a user manually moving the operating handle 88 to the right or left, respectfully, causing corresponding movement of the top of the movable contact carrier 64 to the left or right of an equilibrium position. A toggle spring 78 is connected at one end to the operating handle 88 and at another end to the bottom of the movable contact carrier 64. When the top of the movable contact carrier 64 is left of the equilibrium position, the toggle spring 78 serves to bias the bottom of the movable contact carrier 64 to the closed position. Conversely, when the top of the movable contact carrier 64 is right of the equilibrium position, the toggle spring 78 biases the bottom of the movable contact carrier to the open position.

The miniature circuit breaker 22 may also be tripped open in response to sensing various types of fault conditions. Upon the occurrence of a moderately sustained overload condition when the contacts 66 and 68 are in a closed position, the bimetal conductor assembly 90 becomes heated and bends to the right. Bending of the bimetal conductor assembly 90 causes an armature 74 and yoke 72 to swing counterclockwise and release a trip lever 76. The trip lever 76 rotates clockwise about pin 80, causing the toggle spring 78 to pull the bottom of the movable contact carrier 64 away from the stationary contact 66 and interrupt the current path.

Similarly, upon the occurrence of an extensive current overload condition, a high magnetic flux field is created around the yoke 72. The armature 74 is drawn toward the yoke 72 by the magnetic field, causing the trip lever 76 to become released from the armature 74. As described in relation to thermal trips, release of the trip lever 76 from the armature 74 causes the toggle spring to pull the bottom of the movable contact carrier 64 away from the stationary contact 66 and interrupt the current path.

Finally, electronic components 92 mounted on a circuit board 96 are provided for processing the signal output of the sensor 21 and determining whether an arcing fault condition or ground fault condition is present. The electronic components 92 for sensing arcing faults are preferably the same as that described in relation to FIGS. 2 or 5, but it will be appreciated that any configuration of electronic components 92 known in the art for detecting arcing faults may be provided. Similarly, the electronic components 92 may reflect any configuration known in the art for sensing ground faults. At any rate, the electronic components 92 are designed to produce either an "AFD" and/or "GFI" trip signal corresponding to whether the circuit breaker 22 is designed to sense arcing faults and/or ground faults. In response to generation of either an AFD or GFI trip signal, a magnetic field is created around a trip solenoid 95, causing a plunger 97 to be drawn to the right. The plunger 97 is connected to a trip link 99, which in turn is connected to the armature 74, such that movement of the plunger 97 causes the armature 74 to be drawn to the right. As previously described, movement of the armature 74 to the right causes the trip lever 76 to be released and the current path through the circuit breaker 22 to be interrupted.

A flag armature 105 is connected to the trip lever 76 by a reset pin 109. When the trip lever 76 becomes released from the armature 74 in response to either of the several types of trip conditions described above, the flag armature 105 is moved to the right and becomes visible through a lens 107, thus providing an external trip indication external to the housing of the circuit breaker 22.

As depicted in FIG. 7, the circuit breaker 22 further includes a trip indicator 94 independent from the flag armature 105 for specifically indicating when the circuit breaker 22 has been tripped open by an arcing fault or ground fault. The trip indicator 94 is connected at one end to the circuit board 96 upon which are mounted the electronic components 92 described above for detecting arcing faults and/or ground faults. Upon generation of either an AFD or GFI trip signal, the circuit breaker 22 is tripped open and the trip indicator 94 provides a visible signal 98 external to the housing of the circuit breaker 22.

Figure 10:
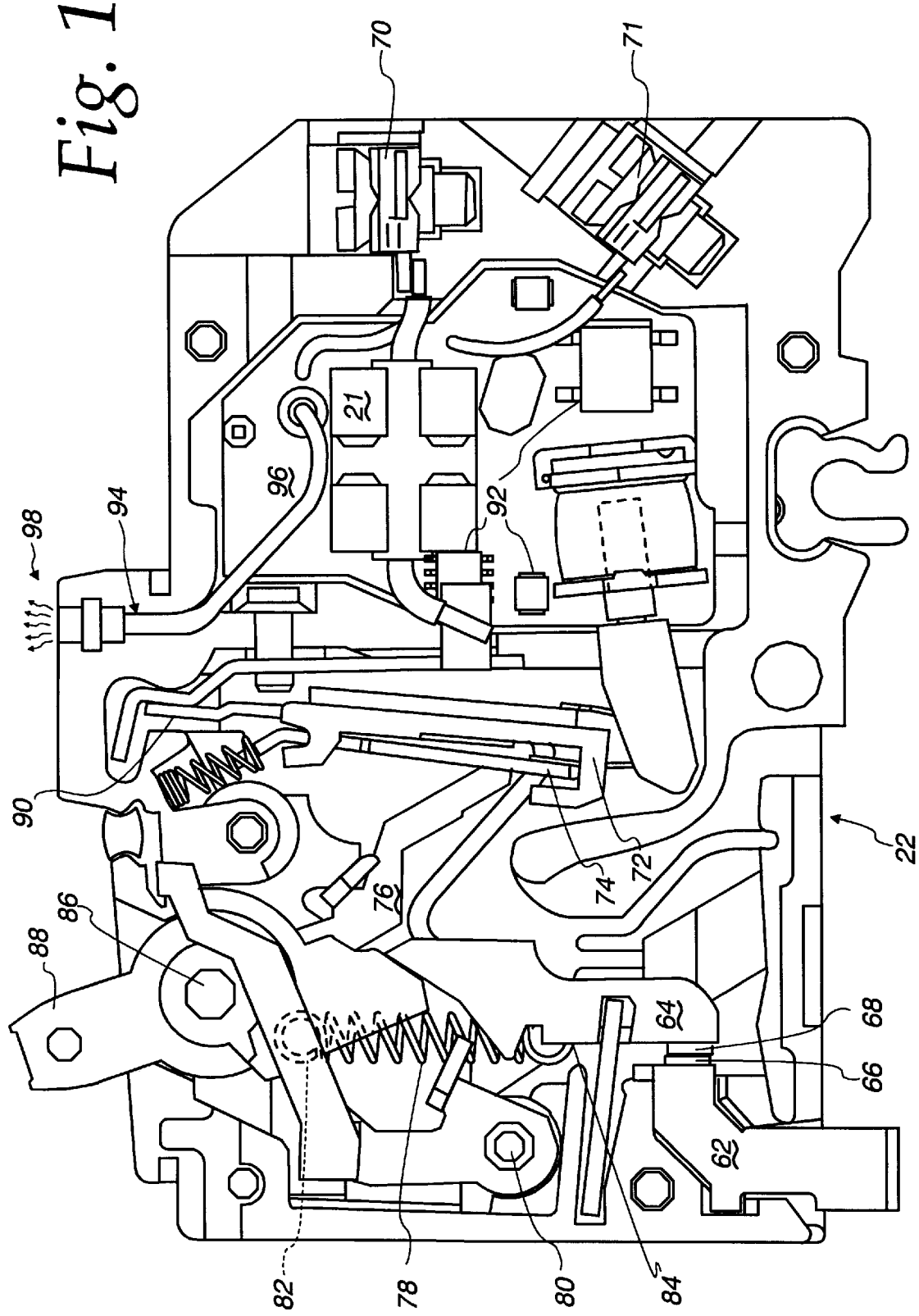
FIG. 10 is a top view of the miniature circuit breaker of FIG. 7 including a trip indicator according to another embodiment of the present invention.

Referring now to FIG. 9, the trip indicator 94 of FIG. 7 will be described in greater detail. The trip indicator 94 comprises a light source 100, a light conduit 102 and an aperture 104. The light source may comprise a light emitting diode (LED), neon bulb or any other suitable light source known in the art. The light source is attached to the circuit board 96 within the circuit breaker housing and is illuminated in response to the generation of either an AFD or GFI trip signal. Illumination of the light source 100 causes light waves to emanate outwardly from the light source in a direction approximated by the arrows 106. A light conduit 102 having one end aligned with the light source subsequently intercepts the light waves emanating from the light source. The light conduit may comprise a light tube (FIGS. 7 and 9), a fiber optic cable (FIG. 10), an open portion of the circuit breaker housing (FIG. 11) or any other suitable means known in the art, but preferably is composed of a nonconductive material so that it does not interfere with the current carrying parts within the circuit breaker. Upon reaching the conduit, the light waves are redirected back and forth between the inner walls of the conduit as approximated by the arrows 106 in FIG. 9, ultimately reaching the aperture 104 at the other end of the conduit and emanating beyond the outer surface 106 of the circuit breaker housing. Accordingly, a user may determine the circuit breaker trip condition by observing the exterior of the circuit breaker housing. Generally, the presence of light emanating outside of the housing indicates that a trip condition has occurred, while the absence of light indicates that a trip condition has not occurred or that the circuit breaker has tripped due to electromechanical or thermal conditions.

Figure 12:
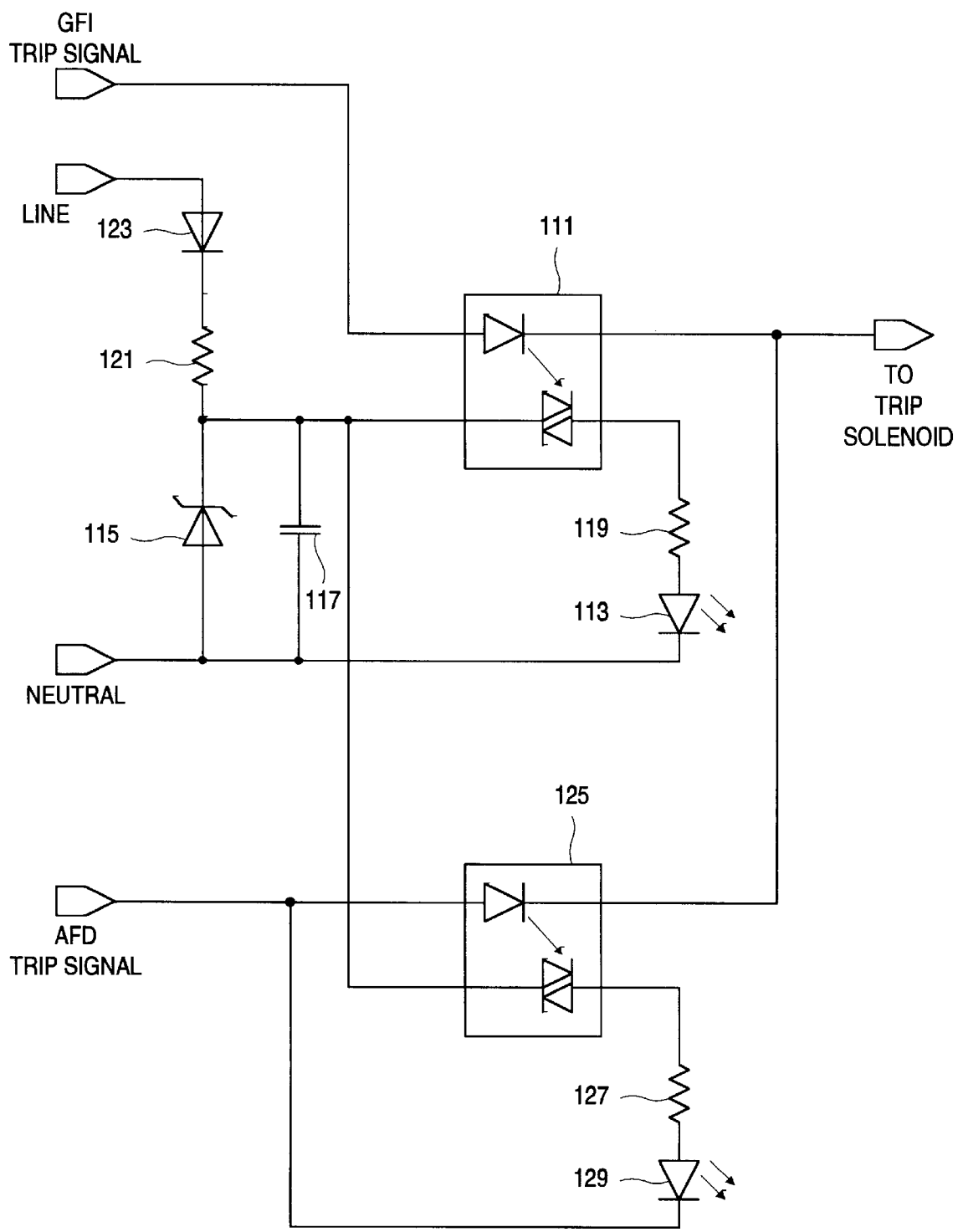
FIG. 12 is a schematic diagram of an electrical circuit for implementing a dual-LED trip indicator according to one embodiment of the present invention.

Preferably, where the circuit breaker 22 contains both AFD and GFI sensing circuitry, the trip indicator 94 will indicate which type of fault condition caused the circuit to be interrupted. This may be accomplished by utilizing multiple light sources, each responding to a different respective AFD or GFI trip signal. Additionally, it is preferred that the light sources or single light source may be multi-colored so that illumination of a particular color will identify whether the circuit breaker 22 was tripped open by an arcing fault or ground fault. A representative circuit for accomplishing this purpose is shown at FIG. 12, which utilizes a red LED 113 for indicating a GFI fault condition and a yellow LED 129 for indicating an AFD fault condition. Of course, it will be appreciated that the color configuration of LEDs may be reversed or that alternative colors other than red and yellow may be utilized.

In the embodiment shown in FIG. 12, each of the LEDs 113 and 129 is electrically connected between the line and neutral conductors on a line side of the circuit breaker, isolated from the load side of the circuit breaker by respective optotriacs 111 and 125 to prevent any potential leak paths from line to load after the breaker has tripped. Activation of a GFI (or AFD) trip signal by the electronic components 92 (FIG. 7) causes an electrical current to flow through the optotriac 111 (or 125) which in turn provides a current path from line to neutral through the LED 113 (or 129). To keep the LED 113 or 129 illuminated after the breaker has tripped, the optotriacs 111 or 125 are latched to a conductive state by powering them directly from the line side of the breaker, thus providing a minimum current through the line side of the optotriac 111 or 125 independent of any signaling from the GFI or AFD circuitry.

Under normal operating conditions, the capacitor 117 has no discharge path, and therefore it retains a voltage level specified by the zener diode 115. Once the optotriac driver 111 (or 125) is triggered by GFI (or AFD) circuitry, the capacitor 117 is able to discharge through the LED 113 (or 129) only if the optotriac driver 111 (or 125) is activated on a negative half cycle. The RC time constant provided by resistor 119 (or 127) and capacitor 117 serves to hold the current above the maximum holding current of the optotriac 111 (or 125). This provides a forward-biased current path to LED 113 or 129 for the duration of the negative half cycle. On the next positive half cycle, the capacitor 117 will charge to the level specified by the zener diode 115. The positive half cycle will also provide current to keep the optotriac 111 or 125 conducting. If the optotriac driver 111 or 125 were initially triggered by the GFI or AFD circuitry on a positive half cycle, current from the positive half cycle would provide the current necessary to keep the optotriac driver 111 or 125 conducting. Once the voltage level of the positive half cycle starts falling below the voltage level that the capacitor 117 was charged to, the capacitor 117 will start discharging through the LED 113 or 129. The RC time constant provided by a resistor 119 (or 127) and the capacitor 117 serves to hold the current above the maximum holding current of the optotriac 111 (or 125).

A zener diode 115 is used as a voltage regulator for keeping the operation of the circuit insensitive to fluctuations in line voltage. A rectifier 123 is used to protect the LED 113 from large reverse voltages. A resistor 121 is used as a current limiter for the current flowing through the LED 113 or 129.

Figure 13:
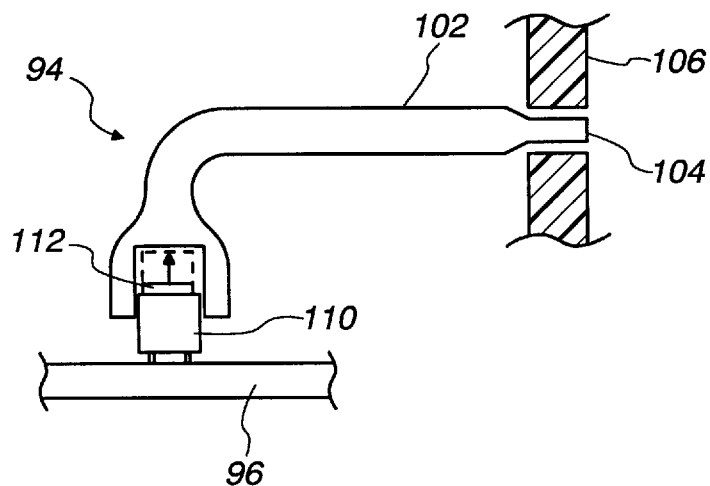
FIG. 13 is a side elevation of a trip indicator which may be positioned within the miniature circuit breaker housing of FIG. 6 according to yet another embodiment of the present invention.

Turning now to FIG. 13, there is depicted an alternative embodiment of the trip indicator 94 in which a plunger 110 is attached to the circuit board 96 within the circuit breaker housing. The plunger 110 is movable between a retracted position and an extended position in response to the activation of the trip signal. When in the extended position, a colored tip 112 extends outwardly from the plunger 110 in response to the generation of a trip signal. A light tube 102 is aligned such that one end of the light tube 102 is adjacent to the colored tip 112 when the plunger is in the extended position. The other end of the light tube extends beyond the outer surface 106 of the circuit breaker housing. Ambient light external to the circuit breaker housing enters the light tube 102 through the aperture 104 and is reflected back and forth along the length of the light tube 102 until reaching the plunger 110. Upon reaching the plunger 110, the light is reflected back toward the aperture 104. When a trip signal has been generated causing the colored tip 112 to extend outwardly from the plunger 110, a reflection of colored light is propagated from the colored tip 112 along the surface of the light tube 102 and emanates out of the aperture 104.

Figure 14:
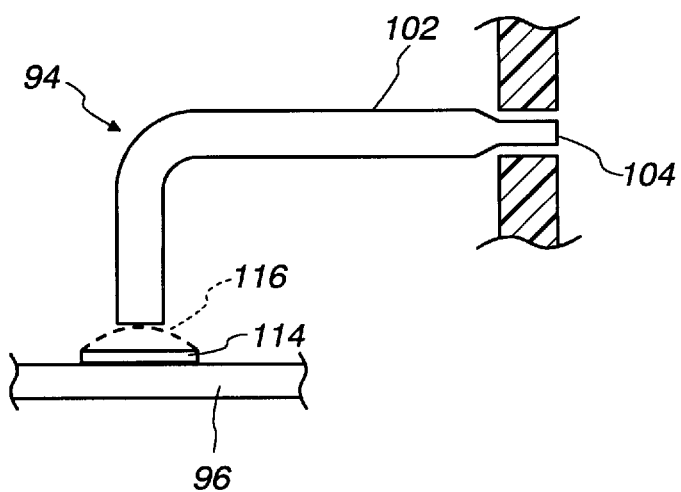
FIG. 14 is a side elevation of a trip indicator which may be positioned within the miniature circuit breaker housing of FIG. 6 according to still yet another embodiment of the present invention.

Turning now to FIG. 14, there is depicted another alternative embodiment of the trip indicator 94 in which a bimetal disk 114 is attached to the circuit board 96 within the circuit breaker housing. The bimetal disk 114 is thermally movable between a generally flat position and a convex position in response to the activation of the trip signal. When in the convex position, a colored top 116 of the bimetal disk 114 extends outwardly from the circuit board 96 in response to the generation of a trip signal. A light tube 102 is aligned such that one end of the light tube is adjacent to the colored top 116 when it is in the convex position. The other end of the light tube extends beyond the outer surface 106 of the circuit breaker housing. Ambient light external to the circuit breaker housing enters the light tube 102 through the aperture 104 and is reflected back and forth along the length of the light tube 102 until reaching the bimetal disk 114. Upon reaching the bimetal disk 114, the light is reflected back toward the aperture 104. When a trip signal has been generated, causing the colored top 116 of the bimetal disk 114 to extend outwardly from the circuit board 96, a reflection of colored light is propagated from the colored top 116 along the surface of the light tube 102 and emanates out of the aperture 104.

As described in relation to FIG. 12, it is preferred that the trip indicator is capable of distinguishing whether the trip signal has been generated by AFD or GFI circuitry. This may be accomplished by utilizing multiple trip indicators of the type shown in FIGS. 13 or 14, each responding to the generation of either an AFD or GFI trip signal. Each of the respective trip indicators may include a different color of colored tip (FIG. 13) or colored top (FIG. 14) such that reflection of light from a particular color identifies the particular type of fault condition which caused the circuit breaker to trip open.

Figure 15:
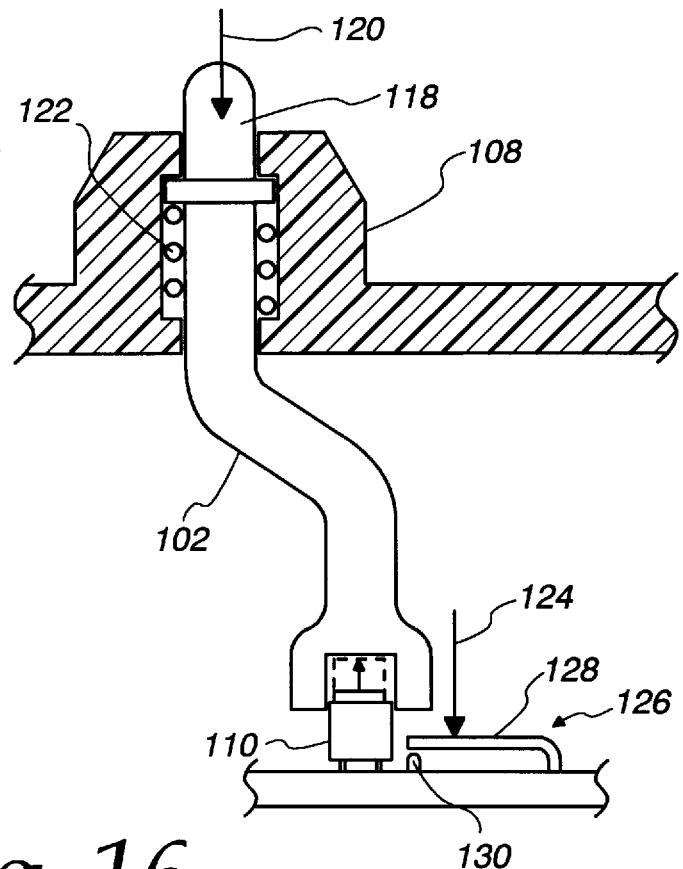
FIG. 15 is a side elevation of an alternative embodiment of the trip indicator of FIG. 12 including a push-to-reset and push-to-test feature.
Figure 16:
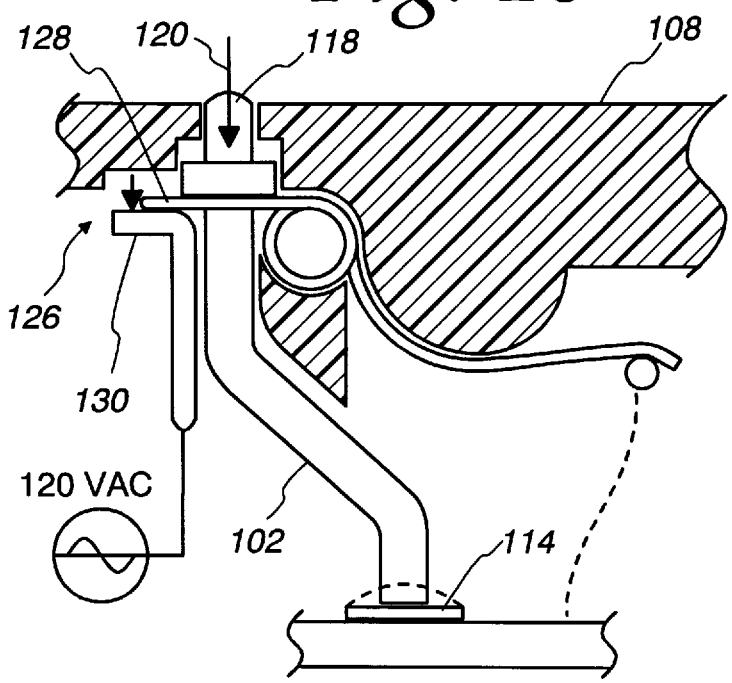
FIG. 16 is a side elevation of an alternative embodiment of the trip indicator of FIG. 14 including a push-to-reset and a push-to-test feature.

Now referring to FIGS. 15 and 16, there are depicted further embodiments of the trip indicator 94 including a reset button 118 and a test switch 126. As shown in FIG. 15, the reset button 118 is integral with the end of the light tube 102 extending beyond the circuit breaker housing 108, but it will be appreciated that the reset button may be located in a different position and physically independent from the light tube 102. The reset button 118 is designed to be depressed inwardly by a user in the direction of arrow 120, thereby causing the light tube to be moved inwardly within the circuit breaker housing 108. The trip indicator 94 may also include a coil spring 122 which is compressed when the reset button 118 is depressed and springs back when the reset button 118 is released. The light tube 102 will preferably be composed of a relatively stiff material, such as polycarbonate or acrylic plastic, so that the bottom portion of the light tube 102 is moved inwardly in the direction of arrow 120 when the reset button 118 is depressed. The bottom portion of the light tube 102 thereafter physically pushes down on the plunger 110 (FIG. 15) or bimetal disk 114 (FIG. 16), restoring the plunger or bimetal disk back to its respective untripped position (e.g. retracted or generally flat position).

Figure 17:
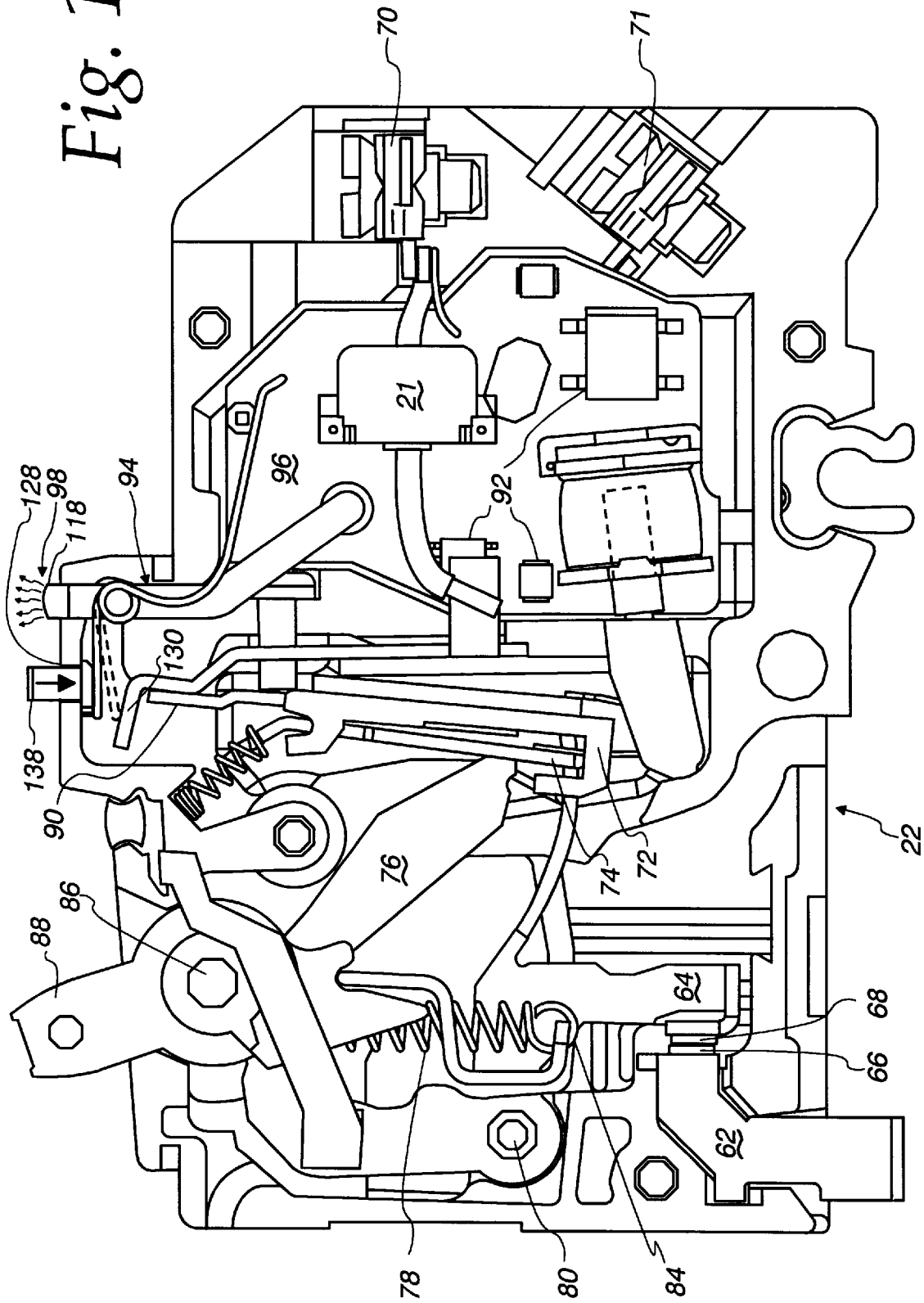
FIG. 17 is a top view of the miniature circuit breaker of FIG. 7 including a push-to-test feature.

The trip indicator 94 may also be provided with a test switch 126 including a first contact 128, a second contact 130 and a push-to-test button for activating the test switch 126. The push-to-test button may comprise the reset button 118 as shown in FIGS. 15 and 16 or may comprise an independent push-to-test button 138 as shown in FIG. 17. In either case, upon depression of the push-to-test button, the first contact 128 is pressed down upon the second contact 130, forming an electrical connection between the two contacts 128, 130. The second contact 130 is connected to a current source 132, while the first contact 128 is connected to the electronic components 92 within the circuit breaker. Thus, depression of the push-to-test button 118 causes the current source 132 to become electrically connected to the electronic components 92 within the circuit breaker. The electronic components 92 thereafter interpret the influx of current from the current source as a fault condition and activate a trip signal in response thereto. Activation of the trip signal causes the trip indicator 94 to produce a light signal or reflected light signal external to the circuit breaker housing as described above. Upon release of the push-to-test button 118, the first contact 128 returns to its initial position apart from the second contact 130, causing an interruption of the electrical path between the current source 132 and the electronic components 92 within the circuit breaker.

In embodiments such as those depicted in FIGS. 15 and 16 in which a single button 118 is used as both a reset button and a push-to-test button, a time-delay circuit must be included within the electronic components 92 within the circuit breaker. Inasmuch as time delay circuits are well known in the art, they will not be described in detail herein. Suffice it to say that upon depression of the reset button/push-to-test button 118, the electronic components 92 within the circuit breaker will not activate a trip signal until the reset button/push-to-test button is depressed for a predetermined period of time. Accordingly, a user intending to reset the trip indicator 94 may press down briefly upon the reset button 118 without inadvertently activating a trip signal.

Figure 18:
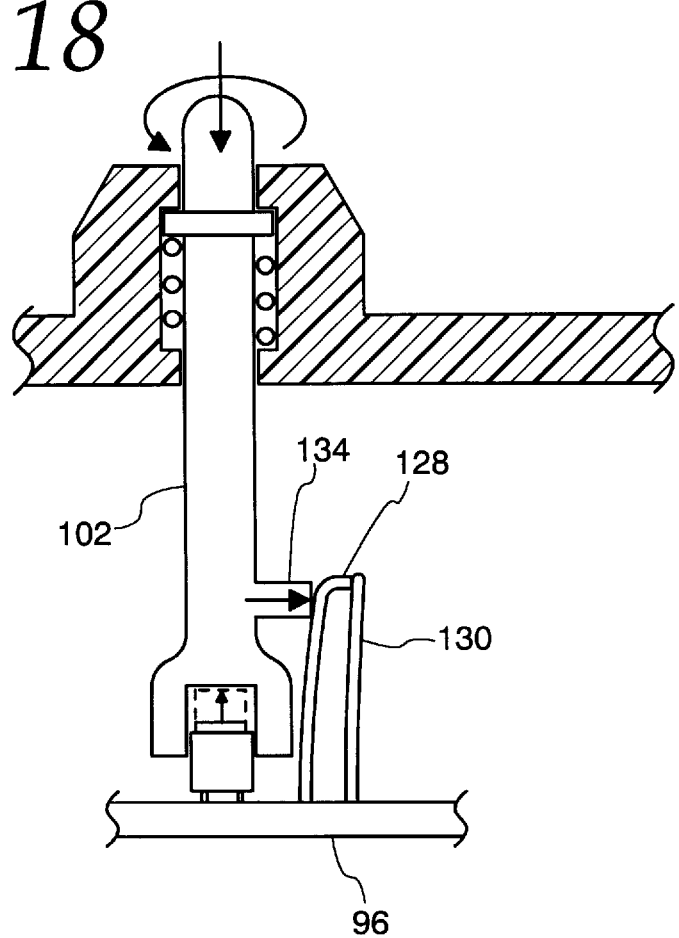
FIG. 18 is a side elevation of an alternative embodiment of the trip indicator of FIG. 13 including a push-to-reset and twist-to-test feature.

A still further embodiment of the trip indicator 94 is depicted in FIG. 18, in which the test switch may be activated by twisting rather than pushing down upon the light tube 102. In this embodiment, a cam 134 is attached to the light tube 102. Rotation of the light tube 102 causes the cam 134 to push the first contact 128 toward the second contact 130 and ultimately form an electrical connection between a current source and the electronic components 92 within the circuit breaker. Then, as described above in relation to FIGS. 15 and 16, the electronic components 92 activate a trip signal which in turn causes the trip indicator 94 to produce a light signal or reflected light signal external to the circuit breaker housing. As shown in FIG. 18, the above-described twist-to-test feature may be combined with the push-to-reset feature discussed in relation to FIGS. 15 and 16. Moreover, the trip indicator 94 may include a twist-to-reset feature combined with a push-to-test feature, a push-to-reset feature and a push-to-test feature, or a twist-to-reset feature and a twist-to-test feature.

While the present invention has been described with reference to one or more particular embodiments, those skilled in the art will recognize that many changes may be made thereto without departing from the spirit and scope of the present invention. Such variations are contemplated as falling within the spirit and scope of the claimed invention, as set forth in the following claims.

What is claimed is:

1. A circuit breaker for interrupting electrical power in a branch circuit of an electrical distribution system in response to detecting electrical hazards in said branch circuit, said branch circuit having line and neutral conductors for connecting a power source to a load, said circuit breaker comprising, in combination:

a line terminal electrically connected to the line conductor of said branch circuit and defining a line side of said circuit breaker;

a load terminal electrically connected to the line conductor of said branch circuit and defining a load side of said circuit breaker, an electrical signal being carried between said line terminal and said load terminal;

an arcing fault detector for monitoring said electrical signal for the occurrence of arcing faults and generating a trip signal in response thereto;

a line interrupter for disconnecting said electrical signal in response to the generation of said trip signal by said arcing fault detector; and a trip indicator comprising a light source adapted to illuminate in response to the generation of said trip signal by said arcing fault detector, activation of said trip indicator being accomplished independently from activation of said line interrupter.

2. A circuit breaker for interrupting electrical power in a branch circuit of an electrical distribution system in response to detecting electrical hazards in said branch circuit, said branch circuit having line and neutral conductors for connecting a power source to a load, said circuit breaker comprising, in combination:

a line terminal electrically connected to the line conductor of said branch circuit and defining a line side of said circuit breaker;

a load terminal electrically connected to the line conductor of said branch circuit and defining a load side of said circuit breaker, an electrical signal being carried between said line terminal and said load terminal;

an arcing fault detector for monitoring said electrical signal for the occurrence of arcing faults and generating a trip signal in response thereto;

a line interrupter for disconnecting said electrical signal in response to the generation of said trip signal by said arcing fault detector;

a trip indicator comprising a light source adapted to illuminate in response to the generation of said trip signal by said arcing fault detector, activation of said trip indicator being accomplished independently from activation of said line interrupter; and a compact housing adapted to enclose said circuit breaker, said housing being removably attached to a panelboard of said electrical distribution system, said trip indicator including a conduit having a first end aligned with the light source and a second end aligned with an opening of the housing, said conduit adapted to convey light between the light source and the opening of the housing in response to illumination of the light source.

3. The circuit breaker of claim 2 wherein the conduit comprises a fiber optic cable.

4. The circuit breaker of claim 2 wherein the conduit comprises a light tube.

5. The circuit breaker of claim 2 wherein the conduit comprises a hollow portion of said compact housing.

6. The circuit breaker according to claim 2 wherein the light source comprises a light emitting diode.

7. The circuit breaker according to claim 2 further comprising a reset button movable between a first position and a second position, said light source being adapted to cease illumination in response to the reset button being moved from said first position to said second position.

8. The circuit breaker according to claim 7 wherein the reset button is integral with the second end of the conduit.

9. The circuit breaker according to claim 2 further comprising a test switch movable between a first position and a second position, said trip signal being activated in response to the test switch being moved from said first position to said second position, said trip signal thereafter becoming deactivated in response to the test switch being returned to said first position.

10. The circuit breaker according to claim 9 wherein the test switch is integral with the second end of the conduit.

11. A circuit breaker for interrupting electrical power in a branch circuit of an electrical distribution system in response to detecting electrical hazards in said branch circuit, said branch circuit having line and neutral conductors for connecting a power source to a load, said circuit breaker comprising, in combination:

a line terminal electrically connected to the line conductor of said branch circuit and defining a line side of said circuit breaker;

a load terminal electrically connected to the line conductor of said branch circuit and defining a load side of said circuit breaker, an electrical signal being carried between said line terminal and said load terminal;

an arcing fault detector for monitoring only said electrical signal carried between said line terminal and said load terminal for the occurrence of arcing faults and generating a trip signal in response thereto;

a line interrupter for disconnecting said electrical signal in response to the generation of said trip signal by said arcing fault detector; and a trip indicator comprising a light source adapted to illuminate in response to the generation of said trip signal by said arcing fault detector, activation of said trip indicator being accomplished independently from activation of said line interrupter.

12. A circuit breaker for interrupting electrical power in a branch circuit of an electrical distribution system in response to detecting electrical hazards in said branch circuit, said branch circuit having line and neutral conductors for connecting a power source to a load, said circuit breaker comprising, in combination:

a line terminal electrically connected to the line conductor of said branch circuit and defining a line side of said circuit breaker;

a load terminal electrically connected to the line conductor of said branch circuit and defining a load side of said circuit breaker, an electrical signal being carried between said line terminal and said load terminal;

an arcing fault detector for monitoring said electrical signal for the occurrence of arcing faults and generating a trip signal in response thereto;

a line interrupter for disconnecting said electrical signal in response to the generation of said trip signal by said arcing fault detector; and a trip indicator comprising a plunger having a colored tip adapted to move between a retracted position and an extended position in response to the generation of said trip signal by said arcing fault detector.

13. The circuit breaker according to claim 12 wherein the occurrence of arcing faults is detected by the arcing fault detector monitoring only said electrical signal carried between said line terminal and said load terminal.

14. The circuit breaker according to claim 12 further comprising a compact housing adapted to enclose said circuit breaker, said housing being removably attached to a panelboard of said electrical distribution system.

15. The circuit breaker according to claim 14 wherein said trip indicator includes a conduit having a first end aligned with the plunger and a second end adjacent to an opening of the housing, the colored tip being adjacent to the first end of the conduit when in said extended position, said second end being exposed to a light source external to the housing, said conduit adapted to convey light external to the housing toward said colored tip to produce a reflection of colored light, said conduit further adapted to convey said reflection of colored light to the opening of the housing.

16. The circuit breaker of claim 15 wherein the conduit comprises a fiber optic cable.

17. The circuit breaker of claim 15 wherein the conduit comprises a light tube.

18. The circuit breaker of claim 15 wherein the conduit comprises a hollow portion of said compact housing.

19. The circuit breaker according to claim 14 further comprising a reset button movable between a first position and a second position, said plunger being moved from said extended position to said retracted position in response to the reset button being moved from said first position to said second position.

20. The circuit breaker according to claim 19 wherein the reset button is integral with the second end of the conduit.

21. The circuit breaker according to claim 15 further comprising a test switch movable between a first position and a second position, said trip signal being activated in response to the test switch being moved from said first position to said second position, said trip signal thereafter becoming deactivated in response to the test switch being returned to the first position.

22. The circuit breaker according to claim 21 wherein the test switch is integral with the second end of the conduit.

23. A circuit breaker for interrupting electrical power in a branch circuit of an electrical distribution system in response to detecting electrical hazards in said branch circuit, said branch circuit having line and neutral conductors for connecting a power source to a load, said circuit breaker comprising, in combination:

a line terminal electrically connected to the line conductor of said branch circuit and defining a line side of said circuit breaker;

a load terminal electrically connected to the line conductor of said branch circuit and defining a load side of said circuit breaker, an electrical signal being carried between said line terminal and said load terminal;

an arcing fault detector for monitoring said electrical signal for the occurrence of arcing faults and generating a trip signal in response thereto;

a line interrupter for disconnecting said electrical signal in response to the generation of said trip signal by said arcing fault detector; and a trip indicator comprising a bimetal disk having a colored top adapted to thermally move between a generally flat position and a convex position in response to activation of said trip signal by said arcing fault detector.

24. The circuit breaker according to claim 23 wherein the occurrence of arcing faults is detected by the arcing fault detector monitoring only said electrical signal carried between said line terminal and said load terminal.

25. The circuit breaker according to claim 23 further comprising a compact housing adapted to enclose said circuit breaker, said housing being removably attached to a panelboard of said electrical distribution system.

26. The circuit breaker according to claim 25 further comprising a conduit having a first end aligned with the bimetal disk and a second end adjacent to the opening of the housing, the colored top being adjacent to the first end of the conduit when the bimetal disk is in said convex position, said second end being exposed to a light source external to the housing, said conduit adapted to convey light external to the housing toward said colored top to produce a reflection of colored light, said conduit further adapted to convey said reflection of colored light to the opening of the housing.

27. The circuit breaker of claim 26 wherein the conduit comprises a fiber optic cable.

28. The circuit breaker of claim 26 wherein the conduit comprises a light tube.

29. The circuit breaker of claim 26 wherein the conduit comprises a hollow portion of said compact housing.

30. The circuit breaker according to claim 26 further comprising a reset button movable between a first position and a second position, said bimetal disk being moved from said convex position to said generally flat position in response to the reset button being moved from said first position to said second position.

31. The circuit breaker according to claim 30 wherein the reset button is integral with the second end of the conduit.

32. The circuit breaker according to claim 26 further comprising a test switch movable between a first position and a second position, said trip signal being activated in response to the test switch being moved from said first position to said second position, said trip signal thereafter becoming deactivated in response to the test switch being returned to the first position.

33. The circuit breaker according to claim 32 wherein the test switch is integral with the second end of the conduit.

34. A circuit breaker for interrupting electrical power in a branch circuit of an electrical distribution system in response to detecting electrical hazards in said branch circuit, said branch circuit having line and neutral conductors for connecting a power source to a load, said circuit breaker comprising, in combination:

a line terminal electrically connected to the line conductor of said branch circuit and defining a line side of said circuit breaker;

a load terminal electrically connected to the line conductor of said branch circuit and defining a load side of said circuit breaker, an electrical signal being carried between said line terminal and said load terminal;

a neutral terminal connected to the neutral conductor of said branch circuit;

an arcing fault detector for monitoring said electrical signal for the occurrence of arcing faults and activating a first trip signal in response thereto;

a second protective device for detecting the occurrence of a second fault condition in said branch circuit and activating a second trip signal in response thereto;

a line interrupter for disconnecting said electrical signal in response to the activation of either of said first and second trip signals; and a trip indicator for indicating which of said first and second trip signals caused the electrical signal to be interrupted by said line interrupter, activation of said trip indicator being accomplished independently from activation of said line interrupter.

35. The circuit breaker according to claim 34 further comprising a compact housing adapted to enclose said circuit breaker, said housing being removably attached to a panelboard of said electrical distribution system.

36. The circuit breaker according to claim 34 wherein the trip indicator comprises a first light source and a second light source, said first light source being adapted to illuminate in response to activation of said first trip signal, said second light source being adapted to illuminate in response to activation of said second trip signal.

37. The circuit breaker according to claim 34 wherein the occurrence of arcing faults is detected by the arcing fault detector monitoring only said electrical signal carried between said line terminal and said load terminal.

38. The circuit breaker according to claim 34 wherein the second protective device comprises a ground fault detector for monitoring each of said line conductor and said neutral conductor for the occurrence of ground faults and generating a trip signal in response thereto.

39. The circuit breaker according to claim 38 wherein the trip indicator comprises a first LED and a second LED, said first LED being adapted to illuminate in response to activation of said first trip signal, said second LED being adapted to illuminate in response to activation of said second trip signal.

40. The circuit breaker according to claim 39 wherein activation of the first trip signal produces a current in an AFD line and activation of the second trip signal produces a current in a GFI line, the trip indicator further comprising a first optocoupler and a second optocoupler, said first optocoupler directing current from said AFD line to said first LED in response to activation of said first trip signal, said second optocoupler directing current from said GFI line to said second LED in response to activation of said second trip signal, said first and second LEDs being respectively illuminated in response to being provided with current by the first and second optocouplers.

41. A circuit breaker for interrupting electrical power in a branch circuit of an electrical distribution system in response to detecting electrical hazards in said branch circuit, said branch circuit having line and neutral conductors for connecting a power source to a load, said circuit breaker comprising, in combination:

a line terminal electrically connected to the line conductor of said branch circuit and defining a line side of said circuit breaker;

a load terminal electrically connected to the line conductor of said branch circuit and defining a load side of said circuit breaker, an electrical signal being carried between said line terminal and said load terminal;

a neutral terminal connected to the neutral conductor of said branch circuit;

an arcing fault detector for monitoring said electrical signal for the occurrence of arcing faults and activating a first trip signal in response thereto;

a second protective device for detecting the occurrence of a second fault condition in said branch circuit and activating a second trip signal in response thereto;

a line interrupter for disconnecting said electrical signal in response to the activation of either of said first and second trip signals; and a trip indicator for indicating which of said first and second trip signals caused the electrical signal to be interrupted by said line interrupter, activation of said trip indicator being accomplished independently from activation of said line interrupter, the trip indicator comprising a multi-colored light source capable of emitting a first color and a second color, said first color being adapted to illuminate in response to activation of said first trip signal, said second color being adapted to illuminate in response to activation of said second trip signal.

42. A circuit breaker for interrupting electrical power in a branch circuit of an electrical distribution system in response to detecting electrical hazards in said branch circuit, said branch circuit having line and neutral conductors for connecting a power source to a load, said circuit breaker comprising, in combination:

a line terminal electrically connected to the line conductor of said branch circuit and defining a line side of said circuit breaker;

a load terminal electrically connected to the line conductor of said branch circuit and defining a load side of said circuit breaker, an electrical signal being carried between said line terminal and said load terminal;

a neutral terminal connected to the neutral conductor of said branch circuit;

an arcing fault detector for monitoring said electrical signal for the occurrence of arcing faults and activating a first trip signal in response thereto;

a second protective device for detecting the occurrence of a second fault condition in said branch circuit and activating a second trip signal in response thereto;

a line interrupter for disconnecting said electrical signal in response to the activation of either of said first and second trip signals; and a trip indicator for indicating which of said first and second trip signals caused the electrical signal to be interrupted by said line interrupter, activation of said trip indicator being accomplished independently from activation of said line interrupter, the trip indicator comprising a first plunger and a second plunger each having a colored tip, said first plunger being adapted to move between a retracted position and an extended position in response to activation of said first trip signal, said second plunger being adapted to move between a retracted position and an extended position in response to activation of said second trip signal.

43. A circuit breaker for interrupting electrical power in a branch circuit of an electrical distribution system in response to detecting electrical hazards in said branch circuit, said branch circuit having line and neutral conductors for connecting a power source to a load, said circuit breaker comprising, in combination:

a line terminal electrically connected to the line conductor of said branch circuit and defining a line side of said circuit breaker;

a load terminal electrically connected to the line conductor of said branch circuit and defining a load side of said circuit breaker, an electrical signal being carried between said line terminal and said load terminal;

a neutral terminal connected to the neutral conductor of said branch circuit;

an arcing fault detector for monitoring said electrical signal for the occurrence of arcing faults and activating a first trip signal in response thereto;

a second protective device for detecting the occurrence of a second fault condition in said branch circuit and activating a second trip signal in response thereto;

a line interrupter for disconnecting said electrical signal in response to the activation of either of said first and second trip signals; and a trip indicator for indicating which of said first and second trip signals caused the electrical signal to be interrupted by said line interrupter, activation of said trip indicator being accomplished independently from activation of said line interrupter, the trip indicator comprising a first plunger and a second plunger each having a tip of a different color, said first plunger being adapted to move between a retracted position and an extended position in response to activation of said first trip signal, said second plunger being adapted to move between a retracted position and an extended position in response to activation of said second trip signal.

44. A circuit breaker for interrupting electrical power in a branch circuit of an electrical distribution system in response to detecting electrical hazards in said branch circuit, said branch circuit having line and neutral conductors for connecting a power source to a load, said circuit breaker comprising, in combination:

a line terminal electrically connected to the line conductor of said branch circuit and defining a line side of said circuit breaker;

a load terminal electrically connected to the line conductor of said branch circuit and defining a load side of said circuit breaker, an electrical signal being carried between said line terminal and said load terminal;

a neutral terminal connected to the neutral conductor of said branch circuit;

an arcing fault detector for monitoring said electrical signal for the occurrence of arcing faults and activating a first trip signal in response thereto;

a second protective device for detecting the occurrence of a second fault condition in said branch circuit and activating a second trip signal in response thereto;

a line interrupter for disconnecting said electrical signal in response to the activation of either of said first and second trip signals; and a trip indicator for indicating which of said first and second trip signals caused the electrical signal to be interrupted by said line interrupter, activation of said trip indicator being accomplished independently from activation of said line interrupter, the trip indicator comprising a first bimetal disk and a second bimetal disk each having a colored top, said first bimetal disk being adapted to thermally move from a generally flat position to a convex position in response to activation of said first trip signal, said second bimetal disk being adapted to thermally move from a generally flat position to a convex position in response to activation of said second tip signal.

45. A circuit breaker for interrupting electrical power in a branch circuit of an electrical distribution system in response to detecting electrical hazards in said branch circuit, said branch circuit having line and neutral conductors for connecting a power source to a load, said circuit breaker comprising, in combination:

a line terminal electrically connected to the line conductor of said branch circuit and defining a line side of said circuit breaker;

a load terminal electrically connected to the line conductor of said branch circuit and defining a load side of said circuit breaker, an electrical signal being carried between said line terminal and said load terminal;

a neutral terminal connected to the neutral conductor of said branch circuit;

an arcing fault detector for monitoring said electrical signal for the occurrence of arcing faults and activating a first trip signal in response thereto;

a second protective device for detecting the occurrence of a second fault condition in said branch circuit and activating a second trip signal in response thereto;

a line interrupter for disconnecting said electrical signal in response to the activation of either of said first and second trip signals; and a trip indicator for indicating which of said first and second trip signals caused the electrical signal to be interrupted by said line interrupter, activation of said trip indicator being accomplished independently from activation of said interrupter, the trip indicator comprising a first bimetal disk and a second bimetal disk each having a top of a different color, said first bimetal disk being adapted to thermally move from a generally flat position to a convex position in response to activation of said first trip signal, said second bimetal disk being adapted to thermally move from a generally flat position to a convex position in response to activation of said second trip signal.

46. A circuit breaker for interrupting electrical power in a branch circuit of an electrical distribution system in response to detecting electrical hazards in said branch circuit, said branch circuit having line and neutral conductors for connecting a power source to a load, said circuit breaker comprising, in combination:

a line terminal electrically connected to the line conductor of said branch circuit and defining a line side of said circuit breaker;

a load terminal electrically connected to the line conductor of said branch circuit and defining a load side of said circuit breaker, an electrical signal being carried between said line terminal and said load terminal;

an arcing fault detector for monitoring said electrical signal for the occurrence of arcing faults and generating a trip signal in response thereto;

a line interrupter for disconnecting said electrical signal in response to the generation of said trip signal by said arcing fault detector; and a trip indicator for indicating when said trip signal has been activated by said arcing fault detector, activation of said trip indicator being accomplished independently from activation of said line interrupter.

47. A circuit breaker for interrupting electrical power in a branch circuit of an electrical distribution system in response to detecting electrical hazards in said branch circuit, said branch circuit having line and neutral conductors for connecting a power source to a load, said circuit breaker comprising, in combination:

a line terminal electrically connected to the line conductor of said branch circuit and defining a line side of said circuit breaker;

a load terminal electrically connected to the line conductor of said branch circuit and defining a load side of said circuit breaker, an electrical signal being carried between said line terminal and said load terminal;

an arcing fault detector for monitoring only said electrical signal carried between said line terminal and said load terminal for the occurrence of arcing faults and generating a trip signal in response thereto;

a line interrupter for disconnecting said electrical signal in response to the generation of said trip signal by said arcing fault detector; and a trip indicator for indicating when said trip signal has been activated by said arcing fault detector, activation of said trip indicator being accomplished independently from activation of said line interrupter.

48. A circuit breaker for interrupting electrical power in a branch circuit of an electrical distribution system in response to detecting electrical hazards in said branch circuit, said branch circuit having line and neutral conductors for connecting a power source to a load, said circuit breaker comprising, in combination:

a line terminal electrically connected to the line conductor of said branch circuit and defining a line side of said circuit breaker;

a load terminal electrically connected to the line conductor of said branch circuit and defining a load side of said circuit breaker, an electrical signal being carried between said line terminal and said load terminal;

an arcing fault detector for monitoring said branch circuit for the occurrence of arcing faults and generating a trip signal in response thereto;

a line interrupter for disconnecting said electrical signal in response to the generation of said trip signal by said arcing fault detector; and a trip indicator comprising a light source adapted to illuminate in response to the generation of said trip signal by said arcing fault detector, activation of said trip indicator being accomplished independently from activation of said line interrupter.

49. A circuit breaker for interrupting electrical power in a branch circuit of an electrical distribution system in response to detecting electrical hazards in said branch circuit, said branch circuit having line and neutral conductors for connecting a power source to a load, said circuit breaker comprising, in combination:

a line terminal electrically connected to the line conductor of said branch circuit and defining a line side of said circuit breaker;

a load terminal electrically connected to the line conductor of said branch circuit and defining a load side of said circuit breaker, an electrical signal being carried between said line terminal and said load terminal;

an arcing fault detector for monitoring said branch circuit for the occurrence of arcing faults and generating a trip signal in response thereto;

a line interrupter for disconnecting said electrical signal in response to the generation of said trip signal by said arcing fault detector; and a trip indicator comprising a plunger having a colored tip adapted to move between a retracted position and an extended position in response to the generation of said trip signal by said arcing fault detector.

50. A circuit breaker for interrupting electrical power in a branch circuit of an electrical distribution system in response to detecting electrical hazards in said branch circuit, said branch circuit having line and neutral conductors for connecting a power source to a load, said circuit breaker comprising, in combination:

a line terminal electrically connected to the line conductor of said branch circuit and defining a line side of said circuit breaker;

a load terminal electrically connected to the line conductor of said branch circuit and defining a load side of said circuit breaker, an electrical signal being carried between said line terminal and said load terminal;

an arcing fault detector for monitoring said branch circuit for the occurrence of arcing faults and generating a trip signal in response thereto;

a line interrupter for disconnecting said electrical signal in response to the generation of said trip signal by said arcing fault detector; and a trip indicator comprising a bimetal disk having a colored top adapted to thermally move between a generally flat position and a convex position in response to activation of said trip signal by said arcing fault detector.

51. A circuit breaker for interrupting electrical power in a branch circuit of an electrical distribution system in response to detecting electrical hazards in said branch circuit, said branch circuit having line and neutral conductors for connecting a power source to a load, said circuit breaker comprising, in combination:

a line terminal electrically connected to the line conductor of said branch circuit and defining a line side of said circuit breaker;

a load terminal electrically connected to the line conductor of said branch circuit and defining a load side of said circuit breaker, an electrical signal being carried between said line terminal and said load terminal;

a neutral terminal connected to the neutral conductor of said branch circuit;

an arcing fault detector for monitoring said branch circuit for the occurrence of arcing faults and activating a first trip signal in response thereto;

a second protective device for detecting the occurrence of a second fault condition in said branch circuit and activating a second trip signal in response thereto;

a line interrupter for disconnecting said electrical signal in response to the activation of either of said first and second trip signals; and a trip indicator for indicating which of said first and second trip signals caused the electrical signal to be interrupted by said line interrupter, activation of said trip indicator being accomplished independently from activation of said line interrupter.

52. A circuit breaker for interrupting electrical power in a branch circuit of an electrical distribution system in response to detecting electrical hazards in said branch circuit, said branch circuit having line and neutral conductors for connecting a power source to a load, said circuit breaker comprising, in combination:

a line terminal electrically connected to the line conductor of said branch circuit and defining a line side of said circuit breaker;

a load terminal electrically connected to the line conductor of said branch circuit and defining a load side of said circuit breaker, an electrical signal being carried between said line terminal and said load terminal;

an arcing fault detector for monitoring said branch circuit for the occurrence of arcing faults and generating a trip signal in response thereto;

a line interrupter for disconnecting said electrical signal in response to the generation of said trip signal by said arcing fault detector; and a trip indicator for indicating when said trip signal has been activated by said arcing fault detector, activation of said trip indicator being accomplished independently from activation of said line interrupter.

\* \* \* \* \*